(12) United States Patent
Baek et al.

(10) Patent No.: US 8,456,891 B2
(45) Date of Patent: Jun. 4, 2013

(54) NONVOLATILE MEMORY CELLS HAVING OXYGEN DIFFUSION BARRIER LAYERS THEREIN

(75) Inventors: In-gyu Baek, Seoul (KR); Myung-jong Kim, Hwaseong-si (KR); Yong-ho Ha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/150,596

(22) Filed: Jun. 1, 2011

(65) Prior Publication Data

US 2011/0291066 A1    Dec. 1, 2011

(30) Foreign Application Priority Data

Jun. 1, 2010  (KR) .......................... 10-2010-0051963

(51) Int. Cl.
*G11C 11/00*  (2006.01)
*H01L 45/00*  (2006.01)

(52) U.S. Cl.
USPC ............ 365/148; 257/2; 257/4; 257/E45.003

(58) Field of Classification Search
None
See application file for complete search history.

(56) References Cited

U.S. PATENT DOCUMENTS

| 7,498,600 | B2 | 3/2009 | Cho et al. |
| 7,538,338 | B2* | 5/2009 | Rinerson et al. ................. 257/4 |
| 8,183,553 | B2* | 5/2012 | Phatak et al. .................... 257/4 |
| 2006/0054950 | A1* | 3/2006 | Baek et al. .................... 257/295 |
| 2008/0211036 | A1* | 9/2008 | Zhao et al. .................... 257/379 |
| 2009/0020740 | A1 | 1/2009 | Chien et al. |
| 2010/0019219 | A1* | 1/2010 | Lee ................................ 257/4 |
| 2011/0227026 | A1* | 9/2011 | Sekar et al. ..................... 257/4 |
| 2011/0297927 | A1* | 12/2011 | Ramaswamy et al. ......... 257/43 |

FOREIGN PATENT DOCUMENTS

| KR | 1020060083368 A | 7/2006 |
| KR | 1020070111840 A | 11/2007 |

* cited by examiner

*Primary Examiner* — Calvin Lee
*Assistant Examiner* — Scott Stowe
(74) *Attorney, Agent, or Firm* — Myers Bigel Sibley & Sajovec, P.A.

(57) ABSTRACT

A nonvolatile memory cell includes first and second electrodes and a data storage layer extending between the first and second electrodes. An oxygen diffusion barrier layer is provided, which extends between the data storage layer and the first electrode. An oxygen gettering layer is also provided, which extends between the oxygen diffusion barrier layer and the data storage layer. The oxygen diffusion barrier layer includes aluminum oxide, the oxygen gettering layer includes titanium, the data storage layer includes a metal oxide, such as magnesium oxide, and at least one of the first and second electrodes includes a material selected from a group consisting of tungsten, polysilicon, aluminum, titanium nitride silicide and conductive nitrides.

20 Claims, 23 Drawing Sheets

NONVOLATILE MEMORY CELLS HAVING OXYGEN DIFFUSION BARRIER LAYERS THEREIN

REFERENCE TO PRIORITY APPLICATION

This application claims the benefit of Korean Patent Application No. 10-2010-0051963, filed Jun. 1, 2010, in the Korean Intellectual Property Office, the disclosure of which is hereby incorporated herein in its entirety by reference.

BACKGROUND

Semiconductor memory devices may be classified into volatile memory devices such as dynamic random access memory (DRAM) and nonvolatile memory devices, wherein in the volatile memory devices, data stored in a memory cell is lost when power thereof is turned off and in the nonvolatile memory devices, data is maintained even if power thereof is turned off. Examples of nonvolatile memory devices may include magnetic random access memory (MRAM), ferroelectric random access memory (FRAM), phase-change random access memory (PRAM), and resistive random access memory (RRAM). Volatile memory devices typically have high integration degree and rapid operational speeds. On the other hand, nonvolatile memory devices typically have a lower integration degree and slower operational speeds than those of DRAMs.

Such nonvolatile memory devices have been widely developed in terms of improvement on integration degree, operational characteristics, low power operation, and data retention characteristics. Resistive memory devices have less deterioration in recording/reproducing, may be driven at a high temperature, and have data safety, compared with other nonvolatile memory devices. Also, the resistive memory devices may be driven at a high speed with low power consumption and highly integrated. However, when a recording operation is repeated, the cycling endurance of the resistive memory devices may be deteriorated.

SUMMARY OF THE INVENTION

Integrated circuit memory devices according to embodiments of the invention include nonvolatile memory devices embodying arrays of nonvolatile memory cells therein. According to some of these embodiments of the invention, a nonvolatile memory cell includes first and second electrodes and a data storage layer extending between the first and second electrodes. An oxygen diffusion barrier layer is provided, which extends between the data storage layer and the first electrode. An oxygen gettering layer is also provided, which extends between the oxygen diffusion barrier layer and the data storage layer. In some embodiments of the invention, the oxygen diffusion barrier layer includes aluminum oxide, the oxygen gettering layer includes titanium, the data storage layer includes a metal oxide, such as magnesium oxide, and at least one of the first and second electrodes includes a material selected from a group consisting of tungsten, polysilicon, aluminum, titanium nitride silicide and conductive nitrides. In particular, the oxygen gettering layer preferably includes a material having a higher bonding strength with oxygen relative to the data storage layer.

According to additional embodiments of the invention, a capping diffusion barrier layer is provided, which contacts sidewalls of the first and second electrodes, the data storage layer and the oxygen diffusion barrier layer. The capping diffusion barrier layer may be formed of the same material as the oxygen diffusion barrier layer.

According to still further embodiments of the invention, a nonvolatile memory cell is provided that includes first and second electrodes, a data storage layer extending between the first and second electrodes and an oxygen diffusion barrier layer extending between the data storage layer and the first electrode. An oxygen gettering layer is provided, which extends between the oxygen diffusion barrier layer and the data storage layer. A capping diffusion barrier layer is provided, which contacts sidewalls of the data storage layer, the oxygen diffusion barrier layer and the oxygen gettering layer. The capping diffusion barrier layer can include the same material as the oxygen diffusion barrier layer. In some of these embodiments of the invention, the oxygen diffusion barrier layer includes aluminum oxide and the oxygen gettering layer includes titanium.

Additional embodiments of the invention include a nonvolatile memory cell containing a lower electrode, a first oxygen diffusion barrier layer including aluminum oxide on the lower electrode and a metal oxide data storage layer on the first oxygen diffusion barrier layer. An oxygen gettering layer containing titanium is also provided on the metal oxide data storage layer. A second oxygen diffusion barrier layer, which includes aluminum oxide, is provided on the oxygen gettering layer and an upper electrode is provided on the second oxygen diffusion barrier layer. An aluminum oxide layer may also be provided, which contacts sidewalls of the lower electrode, the metal oxide data storage layer and the upper electrode.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
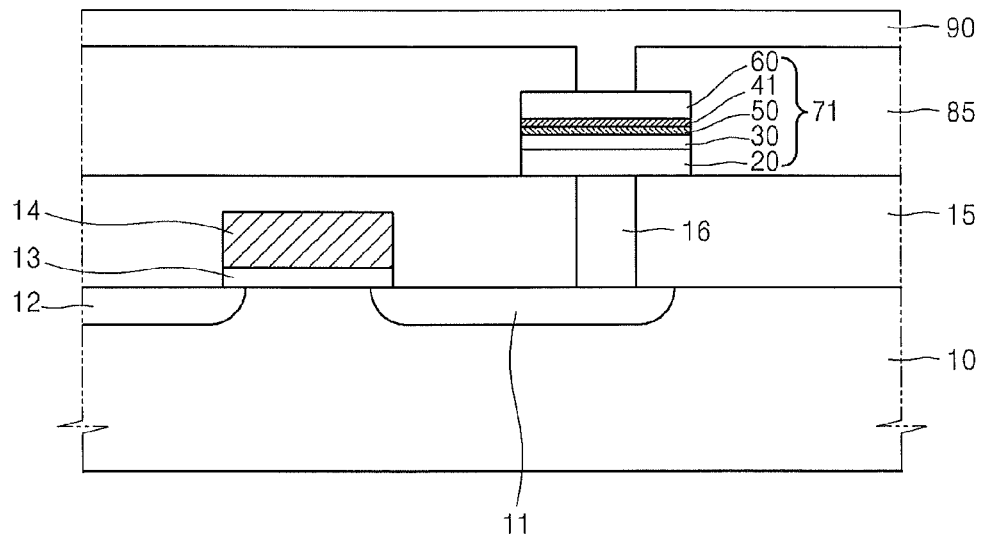
FIG. 1 is a cross-sectional view of a resistive memory device according to an embodiment of the inventive concept.

Hereinafter, embodiments of the inventive concept will be described in more detail with reference to the accompanying drawings. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the sizes of elements may be exaggerated for convenience of description. In particular, thicknesses of lower electrodes, upper electrodes, data storage layers, diffusion barrier layers, and oxygen getter layers may be exaggerated for clarity regardless of a relative size ratio.

Throughout the specification, it will be understood that when an element such as a layer, an area, or a substrate is referred to as being "formed on," another element, it can be directly or indirectly formed on the other element or layer. That is, intervening elements may be present. In contrast, when an element is referred to as being "directly formed on" another element, there are no intervening elements or layers present. In the drawings, like reference numerals denote like elements.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

It will be understood that when the term 'layer' is used to indicate a part of a structure generated by stacking one element upon another elements. Thus, the term 'layer' may not be construed as being limited to a thickness of elements.

A resistive memory device according to an embodiment of the inventive concept includes a data storage layer formed of a metal oxide. In the data storage layer, an electrical resistance value may be changed according to an electric signal. Such a change in the electrical resistance may contribute to oxidization and reduction occurring due to the movement of oxygen in the metal oxide.

An amount of oxygen in the metal oxide may be maintained as in an oxygen deficiency state that is insufficient compared with a thermodynamically stable state. Accordingly, a fixed amount of oxygen may be maintained in an appropriately insufficient state and not flow out of a memory cell.

The inventors of the inventive concept have found that the degree of movement of oxygen varies in the metal oxide according to materials used to form electrodes disposed on upper and lower parts of a data storage layer and thus cycling endurance of a memory device varies.

Figure 7:
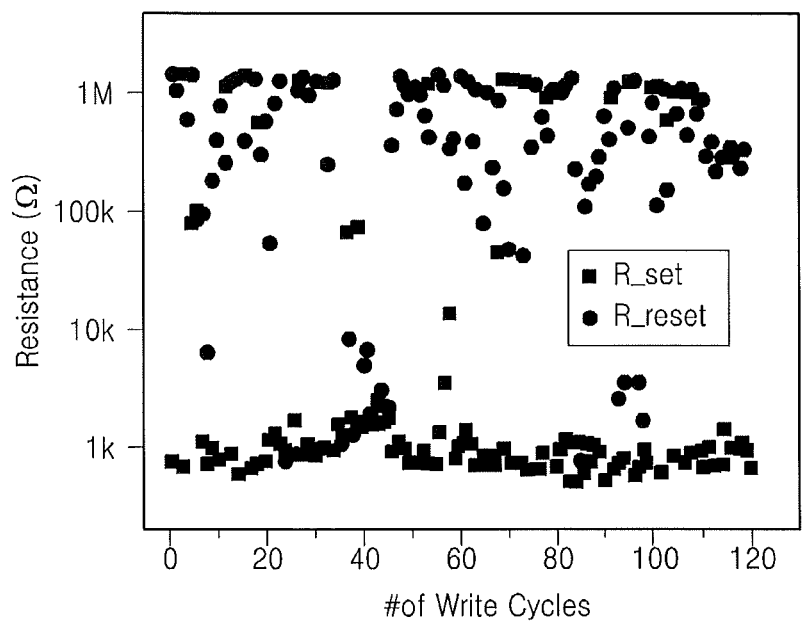
FIG. 7 is a graph showing cycling endurance of a resistive memory device using an electrode including polysilicon.
Figure 8:
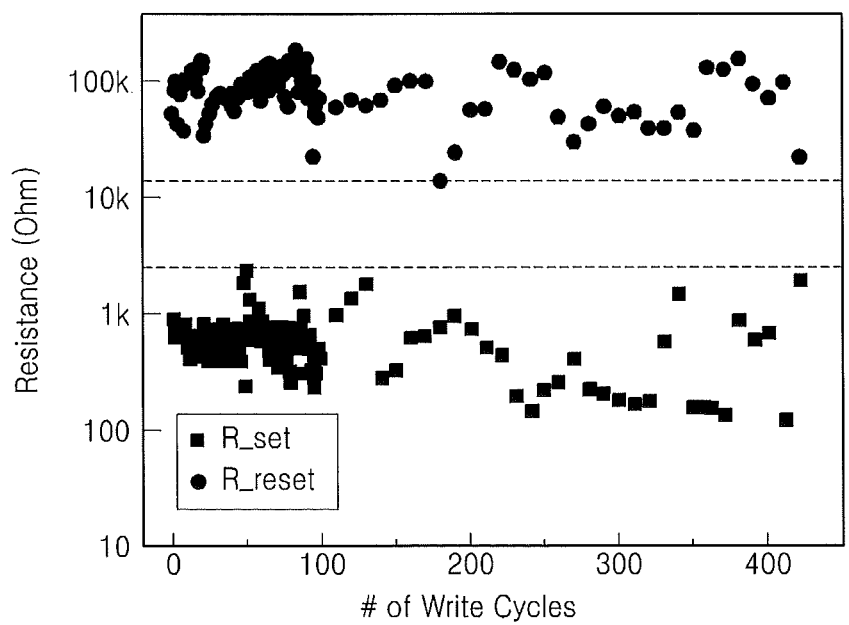
FIG. 8 is a graph showing cycling endurance of a resistive memory device using an electrode including tungsten.
Figure 9:
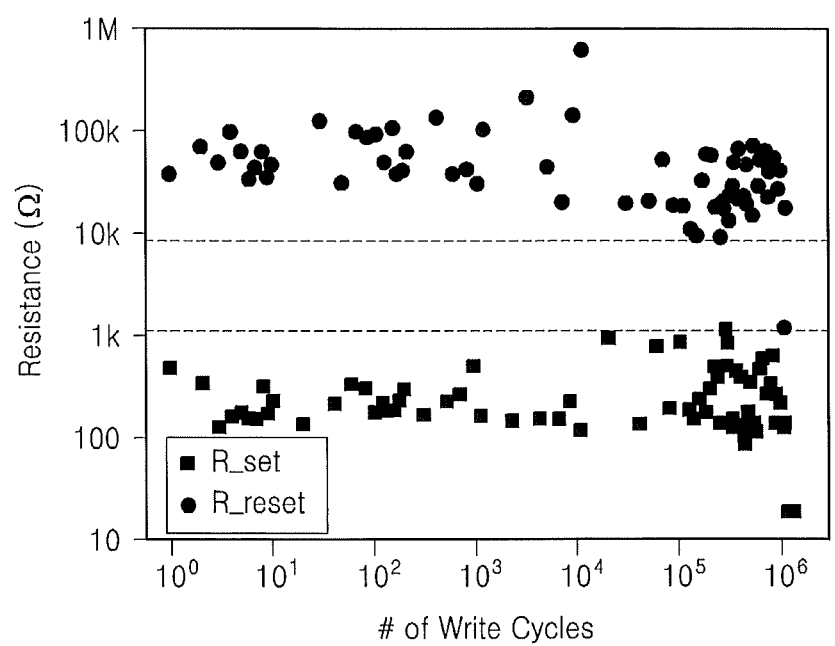
FIG. 9 is a graph showing cycling endurance of a resistive memory device using an electrode including a noble metal.

FIG. 7 is a graph showing cycling endurance of a resistive memory device using an electrode including polysilicon, FIG. 8 is a graph showing cycling endurance of a resistive memory device using an electrode including tungsten, and FIG. 9 is a graph showing cycling endurance of a resistive memory device using an electrode including a noble metal.

Referring to FIG. 7, when an electrode including polysilicon is used, switching of the resistive memory device is unstable even before the number of write cycles is repeated for about 100 times. Referring to FIG. 8, when an electrode including tungsten is used, switching of the resistive memory device is stable even if the number of write cycles is repeated for about a few hundred times. Referring to FIG. 9, when an electrode including a noble metal is used, switching of the resistive memory device is stable even if the number of write cycles is repeated for about $10^6$ times. The noble metal is a metal in which oxidization or corrosion hardly occurs in air and may include, for example, at least one selected from the group consisting of Au, Ag, Pt, Pd, Rh, Ir, Ru, and Os.

As described above, the cycling endurance of the resistive memory device varies according to the materials used to form the electrode due to the difference in bonding strength between the material used to form the electrode and oxygen. The bonding strength with oxygen increases in the order of a noble metal, tungsten, and polysilicon. When the electrode is easily oxidized, oxygen concentration in the metal oxide that forms the data storage layer is gradually decreased and at some point, the data storage layer may be no longer oxidized. Thus, a set stuck state in which the data storage layer is in a low-resistance state may occur. When the set stuck state occurs, cycling endurance of a resistive memory device deteriorates.

Accordingly, in order to improve cycling endurance of a resistive memory device, an electrode of the resistive memory device may be formed of a material that is not easily oxidized. In this regard, the electrode of a resistive memory device may be required to be formed of a noble metal. However, when a noble metal including at least one selected from the group consisting of Au, Ag, Pt, Pd, Rh, Ir, Ru, and Os is used, a manufacturing cost of a resistive memory device increases and contamination may occur in a semiconductor manufacturing process line due to the noble metal.

In this regard, the inventors of the inventive concept have found a structure which improves the cycling endurance of a resistive memory device even when a noble metal is not used to form an electrode of the resistive memory device. In such a structure, a diffusion barrier layer for preventing diffusion of oxygen may be interposed between the electrode of the resistive memory device and a data storage layer.

Elements of resistive memory devices illustrated in FIGS. 1 through 6, 19-21, and 25-31 are provided to describe various forms of storage nodes. However, the elements are not intended to limit the scope of the invention.

FIG. 1 is a cross-sectional view of a resistive memory device 101 according to an embodiment of the inventive concept. Referring to FIG. 1, a gate pattern including a gate insulating layer 13 and a gate electrode 14 is formed on a semiconductor substrate 10. The gate insulating layer 13 may include a silicon oxide layer. The gate electrode 14 may include polysilicon. A source region 12 and a drain region 11 are each formed in the semiconductor substrate 10, adjacent to the gate pattern.

A first interlayer insulating layer 15 is formed on the semiconductor substrate 10 to cover the gate pattern including the gate insulating layer 13 and the gate electrode 14, and a contact plug 16 is formed in the first interlayer insulating layer 15 to connect to the drain region 11. A storage node 71 is formed on the first interlayer insulating layer 15 to connect to the contact plug 16. A structure of the storage node 71 will now be described.

The storage node 71 includes an electrode formed of a lower electrode 20 and an upper electrode 60, and a data storage layer 30 interposed between the lower electrode 20 and the upper electrode 60.

The lower electrode 20 and the upper electrode 60 may each have a higher bonding strength with oxygen than the bonding strength between a noble metal and oxygen, and may each include, for example, at least one selected from the group consisting of tungsten (W), polysilicon (poly-Si), aluminum (Al), titanium nitride silicide (TiSiN), and a conductive nitride (for example, a titanium nitride (TiN), a tantalum nitride (TaN), a tungsten nitride (WN), a titanium aluminum nitride (TiAlN), or a tantalum aluminum nitride (TaAlN).

The data storage layer 30 may include a metal oxide of which the electrical resistance changes according to an applied voltage. For example, the data storage layer 30 may include at least one selected from the group consisting of MgO, NiO, $Nb_2O_5$, $TiO_2$, $Al_2O_3$, $V_2O_5$, $WO_3$, ZnO, and CoO. The data storage layer 30 may include a magnesium oxide (MgO).

A diffusion barrier layer 41 may be interposed between the upper electrode 60 and the data storage layer 30. The diffusion barrier layer 41 prevents oxygen from being diffused between the upper electrode 60 and the data storage layer 30.

A material used to form the diffusion barrier layer 41 may have a higher bonding strength with oxygen than that of a material used to form the data storage layer 30. For example, the diffusion barrier layer 41 may include an aluminum oxide ($Al_xO_y$, here, x and y are positive real numbers, respectively). An oxygen getter layer 50 may be interposed between the data storage layer 30 and the diffusion barrier layer 41. A material used to form the oxygen getter layer 50 may have a higher bonding strength with oxygen than that of a material used to form the data storage layer 30. For example, when the data storage layer 30 includes magnesium oxide (MgO), the oxygen getter layer 50 may include titanium (Ti). Thus, an oxygen-deficiency state may be maintained in the metal oxide used to form the data storage layer 30 due to the oxygen getter layer 50. In FIG. 1, the oxygen getter layer 50 is interposed between the data storage layer 30 and the diffusion barrier layer 41. However, an additional oxygen getter layer (not illustrated) may be interposed between the data storage layer 30 and the lower electrode 20.

Materials used to form the data storage layer 30, the oxygen getter layer 50, and the diffusion barrier layer 41 may each be selected so that the bonding strength with oxygen may gradually increase in the order of the data storage layer 30, the oxygen getter layer 50, and the diffusion barrier layer 41.

A second interlayer insulating layer 85 is provided to cover at least a portion of the storage node 71. The second interlayer insulating layer 85 may include the same material as the first interlayer insulating layer 15. However, the inventive concept is not limited thereto, and the second interlayer insulating layer 85 may include a different material from the first interlayer insulating layer 15. A plate electrode 90 is formed on the second interlayer insulating layer 85 to connect to the upper electrode 60. The resistive memory device 101 according to the current embodiment of the inventive concept includes the storage node 71 of FIG. 1. In FIG. 1, peripheral elements coupled to the storage node 71 are provided for convenience of description. However, the elements are not intended to limit the scope of the invention.

Figure 2:
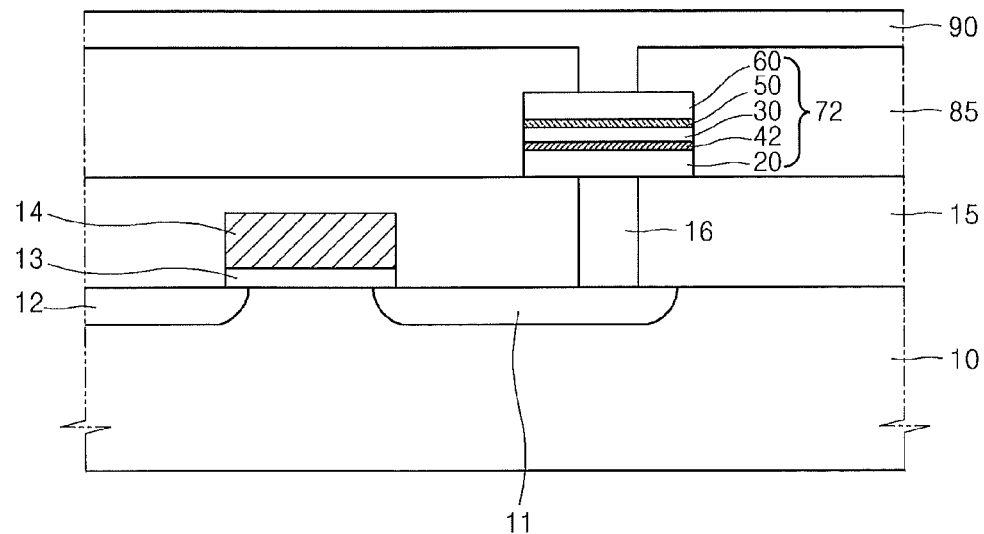
FIG. 2 is a cross-sectional view of a resistive memory device according to another embodiment of the inventive concept.

FIG. 2 is a cross-sectional view of a resistive memory device 102 according to another embodiment of the inventive concept. Like reference numerals denote like elements in FIGS. 1 and 2. Accordingly, descriptions of the same elements may not be repeated.

Referring to FIG. 2, a storage node 72 is formed on the first interlayer insulating layer to connect to the contact plug 16. A structure of the storage node 72 will now be described. The storage node 72 includes an electrode formed of the lower electrode 20 and the upper electrode 60, and the data storage layer 30 interposed between the lower electrode and the upper electrode 60. The lower electrode 20 and the upper electrode 60 may each include, for example, at least one selected from the group consisting of tungsten (W), polysilicon (poly-Si), aluminum (Al), titanium nitride silicide (TiSiN), and a conductive nitride (for example, a titanium nitride (TiN), a tantalum nitride (TaN), a tungsten nitride (WN), a titanium aluminum nitride (TiAlN), or a tantalum aluminum nitride (TaAlN).

A diffusion barrier layer 42 may be interposed between the lower electrode 20 and the data storage layer 30. The diffusion barrier layer 42 prevents oxygen from being diffused between the lower electrode 20 and the data storage layer 30. A material used to form the diffusion barrier layer 42 may have a higher bonding strength with oxygen than that of a material used to form the data storage layer 30. For example, the diffusion barrier layer 42 may include an aluminum oxide ($Al_xO_y$, here, x and y are positive real numbers, respectively).

The oxygen getter layer 50 may be interposed between the data storage layer 30 and the upper electrode 60. A material used to form the oxygen getter layer 50 may have a higher bonding strength with oxygen than that of a material used to form the data storage layer 30. For example, when the data storage layer 30 includes magnesium oxide (MgO), the oxygen getter layer 50 may include titanium (Ti). Thus, an oxygen-deficiency state may be maintained in the metal oxide used to form the data storage layer 30 due to the oxygen getter layer 50. In FIG. 2, the oxygen getter layer 50 is interposed between the data storage layer 30 and the upper electrode 60. However, the inventive concept is not limited thereto, and an additional oxygen getter layer (not illustrated) may be interposed between the data storage layer 30 and the diffusion barrier layer 42.

Materials used to form the data storage layer 30, the oxygen getter layer 50, and the diffusion barrier layer 42 may each be selected so that the bonding strength with oxygen may gradually increase in the order of the data storage layer 30, the oxygen getter layer 50, and the diffusion barrier layer 42. The resistive memory device 102 according to the current embodiment of the inventive concept includes the storage node 72 of FIG. 2. In FIG. 2, peripheral elements coupled to the storage node 72 are provided for convenience of description. However, the elements are not intended to limit the scope of the invention.

Figure 3:
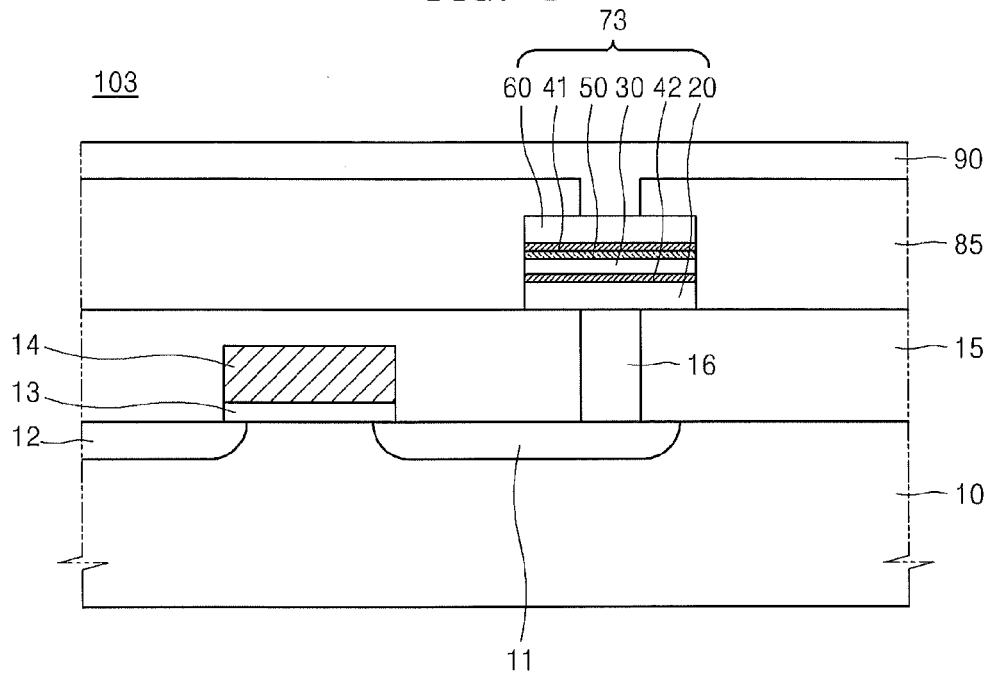
FIG. 3 is a cross-sectional view of a resistive memory device according to another embodiment of the inventive concept.

FIG. 3 is a cross-sectional view of a resistive memory device 103 according to another embodiment of the inventive concept. Like reference numerals denote like elements in FIGS. 1 and 3. Accordingly, descriptions of the same elements may not be repeated. Referring to FIG. 3, a storage node 73 is formed on the first interlayer insulating layer 15 to connect to the contact plug 16. A structure of the storage node 73 will now be described. The storage node 73 includes an electrode formed of the lower electrode 20 and the upper electrode 60, and the data storage layer 30 interposed between the lower electrode 20 and the upper electrode 60. The lower electrode 20 and the upper electrode 60 may each include, for example, at least one selected from the group consisting of tungsten (W), polysilicon (poly-Si), aluminum (Al), titanium nitride silicide (TiSiN), and a conductive nitride (for example, a titanium nitride (TiN), a tantalum nitride (TaN), a tungsten nitride (WN), a titanium aluminum nitride (TiAlN), or a tantalum aluminum nitride (TaAlN). The diffusion barrier layer 41 may be interposed between the upper electrode 60 and the data storage layer 30. Also, the diffusion barrier layer 42 may be interposed between the lower electrode 20 and the data storage layer 30. The diffusion layers 41 and 42 each prevent oxygen from being diffused between the upper electrode 60 and the data storage layer 30 and between the lower electrode 20 and the data storage layer 30. A material used to form the diffusion layers 41 and 42 may each have a higher bonding strength with oxygen than that of a material used to form the data storage layer 30. The diffusion layers 41 and 42 may each include an aluminum oxide ($Al_xO_y$, here, x and y are positive real numbers, respectively).

The oxygen getter layer 50 may be interposed between the data storage layer 30 and the diffusion barrier layer 41. A material used to form the oxygen getter layer 50 may have a higher bonding strength with oxygen than that of a material used to form the data storage layer 30. For example, when the data storage layer 30 includes magnesium oxide (MgO), the oxygen getter layer 50 may include titanium (Ti). Thus, an oxygen-deficiency state may be maintained in the metal oxide used to form the data storage layer 30 due to the oxygen getter layer 50. In FIG. 3, the oxygen getter layer 50 is interposed between the data storage layer 30 and the diffusion barrier layer 41. However, the inventive concept is not limited thereto, and an additional oxygen getter layer (not illustrated) may be interposed between the data storage layer 30 and the diffusion barrier layer 42.

Materials used to form the data storage layer 30, the oxygen getter layer 50, and the diffusion barrier layers 41 and 42 may each be selected so that the bonding strength with oxygen may gradually increase in the order of the data storage layer 30, the oxygen getter layer 50, and the diffusion barrier layers 41 and 42. The resistive memory device 103 according to the current embodiment of the inventive concept includes the storage node 73 of FIG. 3. In FIG. 3, peripheral elements coupled to the storage node 73 are provided for convenience of description. However, the elements are not intended to limit the scope of the invention.

Figure 4:
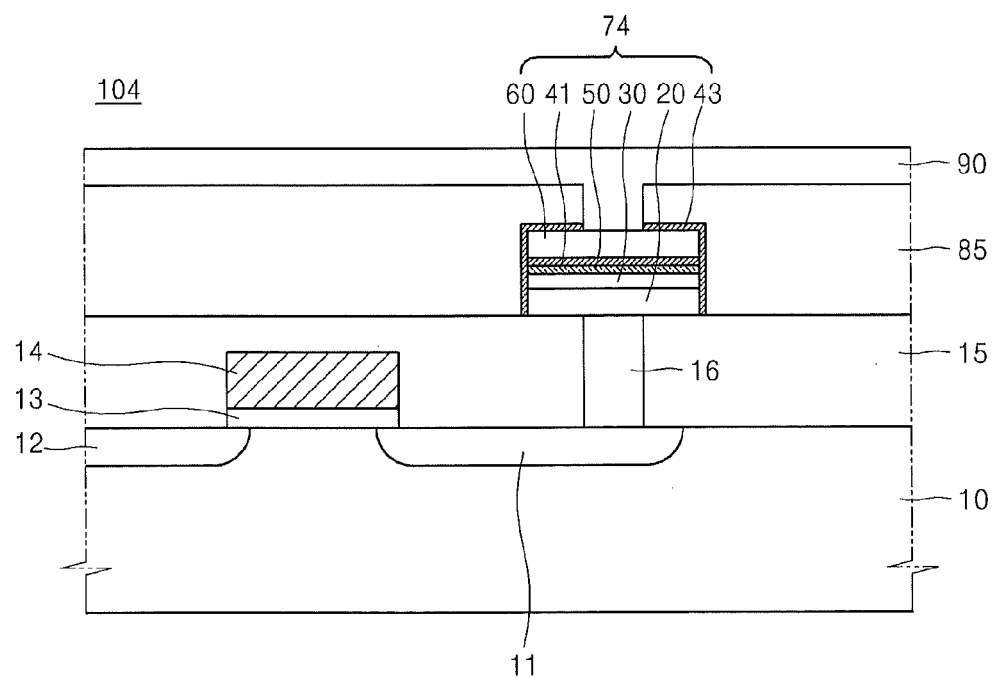
FIG. 4 is a cross-sectional view of a resistive memory device according to another embodiment of the inventive concept.

FIG. 4 is a cross-sectional view of a resistive memory device 104 according to another embodiment of the inventive concept. Like reference numerals denote like elements in FIGS. 1 and 4. Accordingly, descriptions of the same elements may not be repeated. Referring to FIG. 4, a storage node 74 is formed on the first interlayer insulating layer 15 to connect to the contact plug 16. A structure of the storage node 74 will now be described. The storage node 74 includes an electrode formed of the lower electrode 20 and the upper electrode 60, and the data storage layer 30 interposed between the lower electrode 20 and the upper electrode 60. The lower electrode 20 and the upper electrode 60 may each include, for example, at least one selected from the group consisting of tungsten (W), polysilicon (poly-Si), aluminum (Al), titanium nitride silicide (TiSiN), and a conductive nitride (for example, a titanium nitride (TiN), a tantalum nitride (TaN), a tungsten nitride (WN), a titanium aluminum nitride (TiAlN), or a tantalum aluminum nitride (TaAlN). The diffusion barrier layer 41 may be interposed between the upper electrode 60 and the data storage layer 30. The diffusion barrier layer 41 prevents oxygen from being diffused between the upper electrode 60 and the data storage layer 30. A material used to form the diffusion barrier layer 41 may have a higher bonding strength with oxygen than that of a material used to form the data storage layer 30. The diffusion barrier layer 41 may include an aluminum oxide ($Al_xO_y$, here, x and y are positive real numbers, respectively). The oxygen getter layer 50 may be interposed between the data storage layer 30 and the diffusion barrier layer 41. A material used to form the oxygen getter layer 50 may have a higher bonding strength with oxygen than that of a material used to form the data storage layer 30. For example, when the data storage layer 30 includes magnesium oxide (MgO), the oxygen getter layer 50 may include titanium (Ti). Thus, an oxygen-deficiency state may be maintained in the metal oxide used to form the data storage layer 30 due to the oxygen getter layer 50. In FIG. 4, the oxygen getter layer 50 is interposed between the data storage layer 30 and the diffusion barrier layer 41. However, the inventive concept is not limited thereto, and an additional oxygen getter layer (not illustrated) may be interposed between the data storage layer 30 and the lower electrode 20. A capping diffusion barrier layer 43 may be provided to cover the sides of the lower electrode 20, the upper electrode 60, and the data storage layer 30. The capping diffusion barrier layer 43 prevents the sides of the lower electrode 20, the upper electrode 60, and the data storage layer 30 from being exposed and thus prevents oxygen from being diffused between the lower electrode 20, the upper electrode 60, and the data storage layer 30. The capping diffusion barrier layer 43 may include an aluminum oxide ($Al_xO_y$, here, x and y are positive real numbers, respectively). Materials used to form the data storage layer 30, the oxygen getter layer 50, and the diffusion barrier layer 41 may each be selected so that the bonding strength with oxygen may gradually increase in the order of the data storage layer 30, the oxygen getter layer 50, and the diffusion barrier layer 41. The resistive memory device 104 according to the current embodiment of the inventive concept includes the storage node 74 of FIG. 4. In FIG. 4, peripheral elements coupled to the storage node 74 are provided for convenience of description. However, the elements are not intended to limit the scope of the invention.

Figure 5:
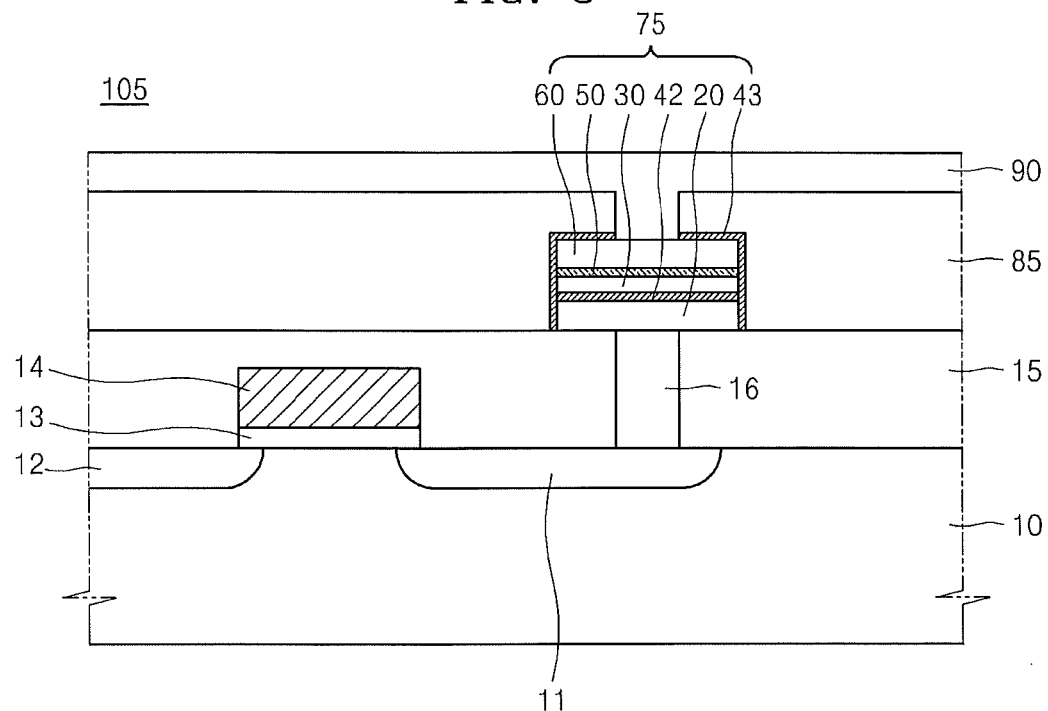
FIG. 5 is a cross-sectional view of a resistive memory device according to another embodiment of the inventive concept.

FIG. 5 is a cross-sectional view of a resistive memory device 105 according to another embodiment of the inventive concept. Like reference numerals denote like elements in FIGS. 2 and 5. Accordingly, descriptions of the same elements may not be repeated. Referring to FIG. 5, a storage node 75 is formed on the first interlayer insulating layer 15 to connect to the contact plug 16. A structure of the storage node 75 will now be described. The storage node 75 includes an electrode formed of the lower electrode 20 and the upper electrode 60, and the data storage layer 30 interposed between the lower electrode 20 and the upper electrode 60. The lower electrode 20 and the upper electrode 60 may each include, for example, at least one selected from the group consisting of tungsten (W), polysilicon (poly-Si), aluminum (Al), titanium nitride silicide (TiSiN), and a conductive nitride (for example, a titanium nitride (TiN), a tantalum nitride (TaN), a tungsten nitride (WN), a titanium aluminum nitride (TiAlN), or a tantalum aluminum nitride (TaAlN). The diffusion barrier layer 42 may be interposed between the lower electrode 20 and the data storage layer 30. The diffusion barrier layer 42 prevents oxygen from being diffused between the lower electrode 20 and the data storage layer 30. A material used to form the diffusion barrier layer 42 may have a higher bonding strength with oxygen than that of a material used to form the data storage layer 30. For example, the diffusion barrier layer 42 may include an aluminum oxide ($Al_xO_y$, here, x and y are positive real numbers, respectively). The oxygen getter layer 50 may be interposed between the data storage layer 30 and the upper electrode 60. A material used to form the oxygen getter layer 50 may have a higher bonding strength with oxygen than that of a material used to form the data storage layer 30. For example, when the data storage layer 30 includes magnesium oxide (MgO), the oxygen getter layer 50 may include titanium (Ti). Thus, an oxygen-deficiency state may be maintained in the metal oxide used to form the data storage layer 30 due to the oxygen getter layer 50. In FIG. 5, the oxygen getter layer 50 is interposed between the data storage layer 30 and the upper electrode 60. However, the inventive concept is not limited thereto, and an additional oxygen getter layer (not illustrated) may be interposed between the data storage layer 30 and the diffusion barrier layer 42. The capping diffusion barrier layer 43 may be provided to cover the sides of the lower electrode 20, the upper electrode 60, and the data storage layer 30. The capping diffusion barrier layer 43 prevents the sides of the lower electrode 20, the upper electrode 60, and the data storage layer 30 from being exposed and thus prevents oxygen from being diffused between the lower electrode 20, the upper electrode 60, and the data storage layer 30. The capping diffusion barrier layer 43 may include an aluminum oxide ($Al_xO_y$, here, x and y are positive real numbers, respectively). Materials used to form the data storage layer 30, the oxygen getter layer 50, and the diffusion barrier layer 42 may each be selected so that the bonding strength with oxygen may gradually increase in the order of the data storage layer 30, the oxygen getter layer 50, and the diffusion barrier layer 42. The resistive memory device 105 according to the current embodiment of the inventive concept includes the storage node 75 of FIG. 5. In FIG. 5, peripheral elements coupled to the storage node 75 are provided for convenience of description. However, the elements are not intended to limit the scope of the invention.

Figure 6:
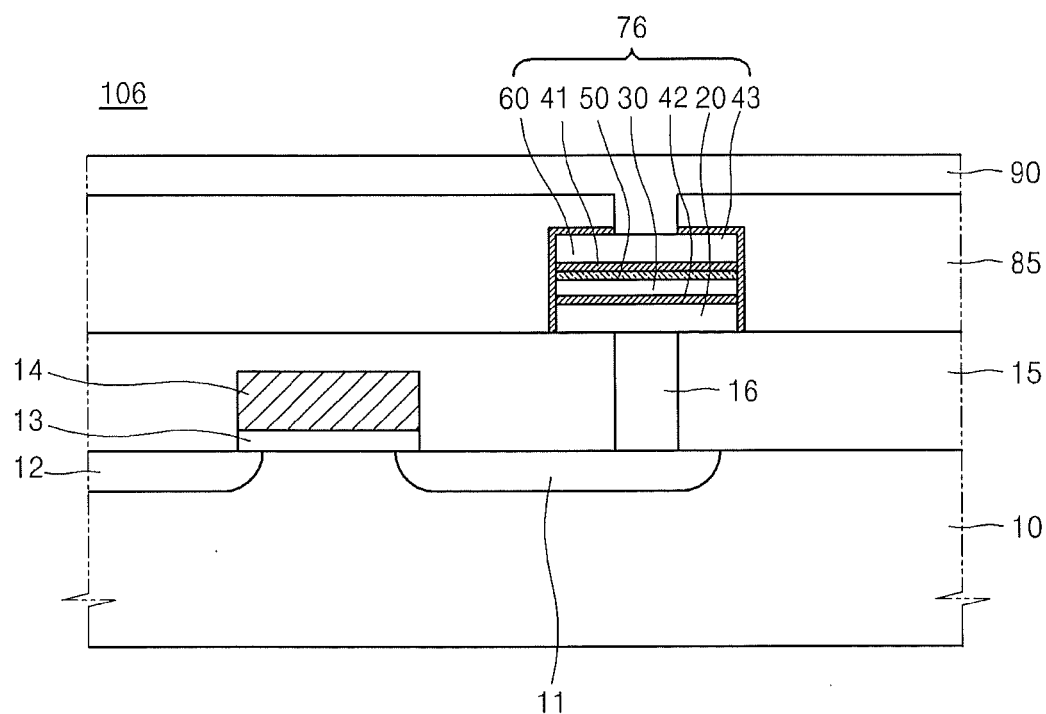
FIG. 6 is a cross-sectional view of a resistive memory device according to another embodiment of the inventive concept.

FIG. 6 is a cross-sectional view of a resistive memory device 106 according to another embodiment of the inventive concept. Like reference numerals denote like elements in FIGS. 3 and 6. Accordingly, descriptions of the same elements may not be repeated. Referring to FIG. 6, a storage node 76 is formed on the first interlayer insulating layer 15 to connect to the contact plug 16. A structure of the storage node 76 will now be described. The storage node 76 includes an electrode formed of the lower electrode 20 and the upper electrode 60, and the data storage layer 30 interposed between the lower electrode 20 and the upper electrode 60. The lower electrode 20 and the upper electrode 60 may each include, for example, at least one selected from the group consisting of tungsten (W), polysilicon (poly-Si), aluminum (Al), titanium nitride silicide (TiSiN), and a conductive nitride (for example, a titanium nitride (TiN), a tantalum nitride (TaN), a tungsten nitride (WN), a titanium aluminum nitride (TiAlN), or a tantalum aluminum nitride (TaAlN).

The diffusion barrier layer 41 may be interposed between the upper electrode 60 and the data storage layer 30. Also, the diffusion barrier layer 42 may be interposed between the lower electrode 20 and the data storage layer 30. The diffusion layers 41 and 42 each prevent oxygen from being diffused between the upper electrode 60 and the data storage layer 30 and between the lower electrode 20 and the data storage layer 30. A material used to form the diffusion layers 41 and 42 may each have a higher bonding strength with oxygen than that of a material used to form the data storage layer 30. The diffusion layers 41 and 42 may each include an aluminum oxide ($Al_xO_y$, here, x and y are positive real numbers, respectively).

The oxygen getter layer 50 may be interposed between the data storage layer 30 and the diffusion barrier layer 41. A material used to form the oxygen getter layer 50 may have a higher bonding strength with oxygen than that of a material used to form the data storage layer 30. For example, when the data storage layer 30 includes magnesium oxide (MgO), the oxygen getter layer 50 may include titanium (Ti). Thus, an oxygen-deficiency state may be maintained in the metal oxide used to form the data storage layer 30 due to the oxygen getter layer 50. In FIG. 6, the oxygen getter layer 50 is interposed between the data storage layer 30 and the diffusion barrier layer 41. However, the inventive concept is not limited thereto, and an additional oxygen getter layer (not illustrated) may be interposed between the data storage layer 30 and the diffusion barrier layer 42.

The capping diffusion barrier layer 43 may be provided to cover the sides of the lower electrode 20, the upper electrode 60, and the data storage layer 30. The capping diffusion barrier layer 43 prevents the sides of the lower electrode 20, the upper electrode 60, and the data storage layer 30 from being exposed and thus prevents oxygen from being diffused between the lower electrode 20, the upper electrode 60, and the data storage layer 30. The capping diffusion barrier layer 43 may include an aluminum oxide ($Al_xO_y$, here, x and y are positive real numbers, respectively). Materials used to form the data storage layer 30, the oxygen getter layer 50, and the diffusion barrier layers 41 and 42 may each be selected so that the bonding strength with oxygen may gradually increase in the order of the data storage layer 30, the oxygen getter layer 50, and the diffusion barrier layers 41 and 42. The resistive memory device 106 according to the current embodiment of the inventive concept includes the storage node 76 of FIG. 6.

In FIG. 6, peripheral elements coupled to the storage node 76 are provided for convenience of description. However, the elements are not intended to limit the scope of the invention. The inventors of the inventive concept have found through an experiment that resistance dispersion is reduced and cycling endurance is improved in the resistive memory devices using the diffusion barrier layers described above.

Figure 10:
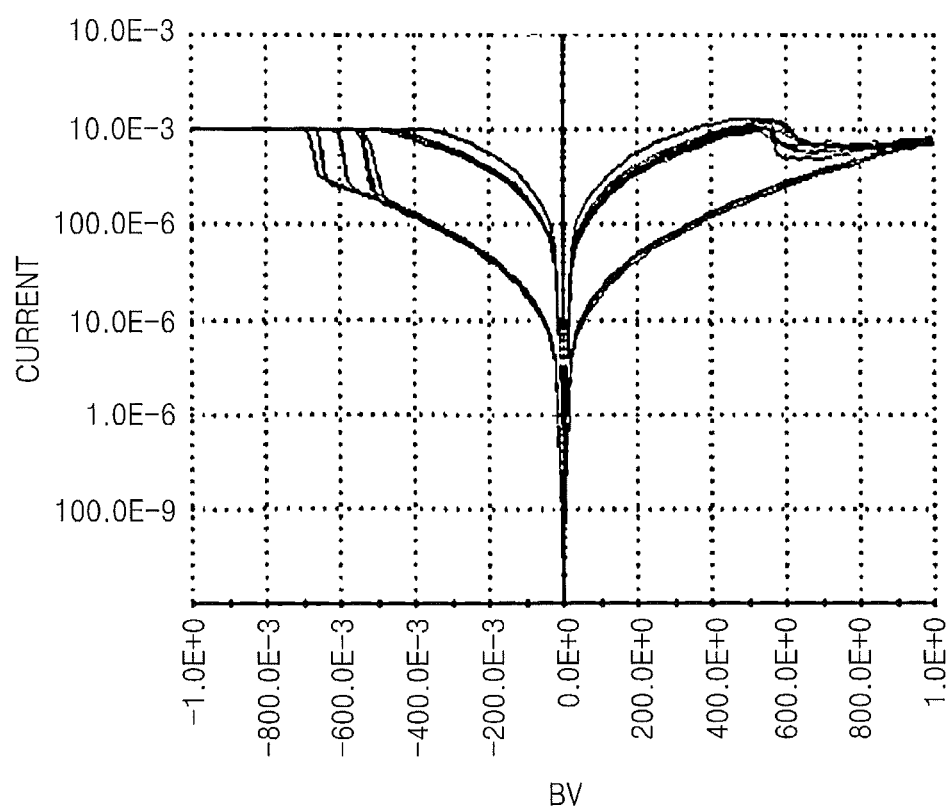
FIG. 10 is a graph showing switching of a resistive memory device using a diffusion barrier layer.
Figure 11:
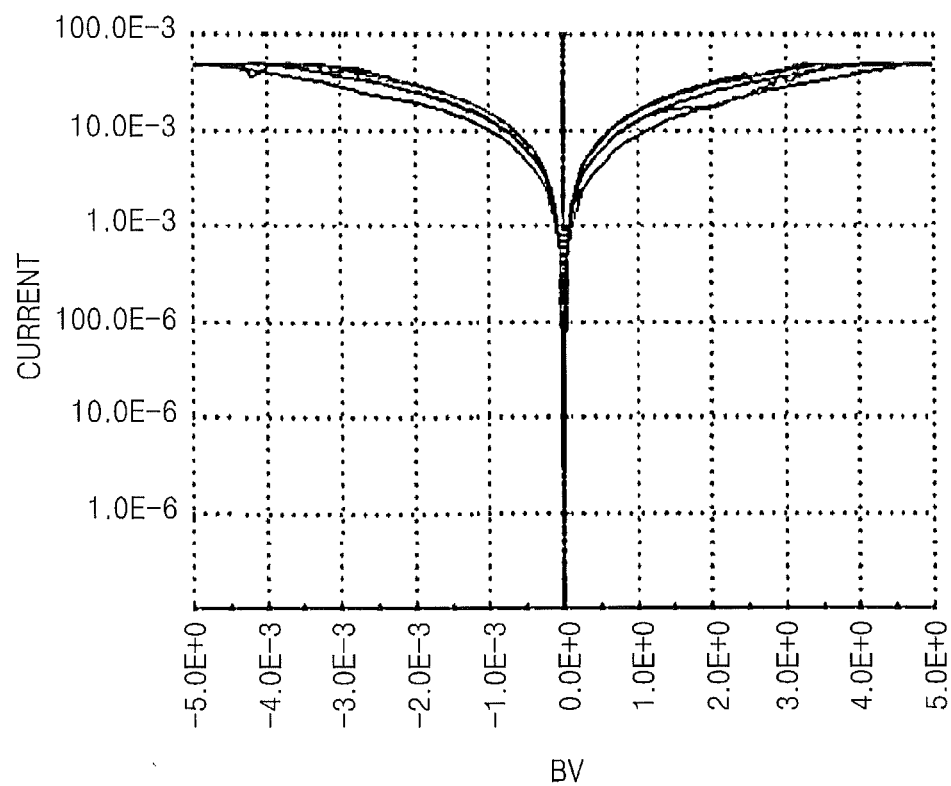
FIG. 11 is a graph showing switching of a resistive memory device without a diffusion barrier layer.

FIG. 10 is a graph showing switching of a resistive memory device using a diffusion barrier layer and FIG. 11 is a graph showing switching of a resistive memory device without a diffusion barrier layer. Also, FIG. 12 is a graph showing cycling endurance of a resistive memory device using a diffusion barrier layer and FIG. 13 is a graph showing cycling endurance of a resistive memory device without a diffusion barrier layer.

Referring to FIGS. 10 and 11, when the diffusion barrier layer is included in the resistive memory device, the on/off ratio in a set state and a reset state is higher than that of when the diffusion barrier layer is not included in the resistive memory device. That is, when the diffusion barrier layer is included in the resistive memory device, a relatively stable switching characteristic may be realized in the resistive memory device.

Figure 12:
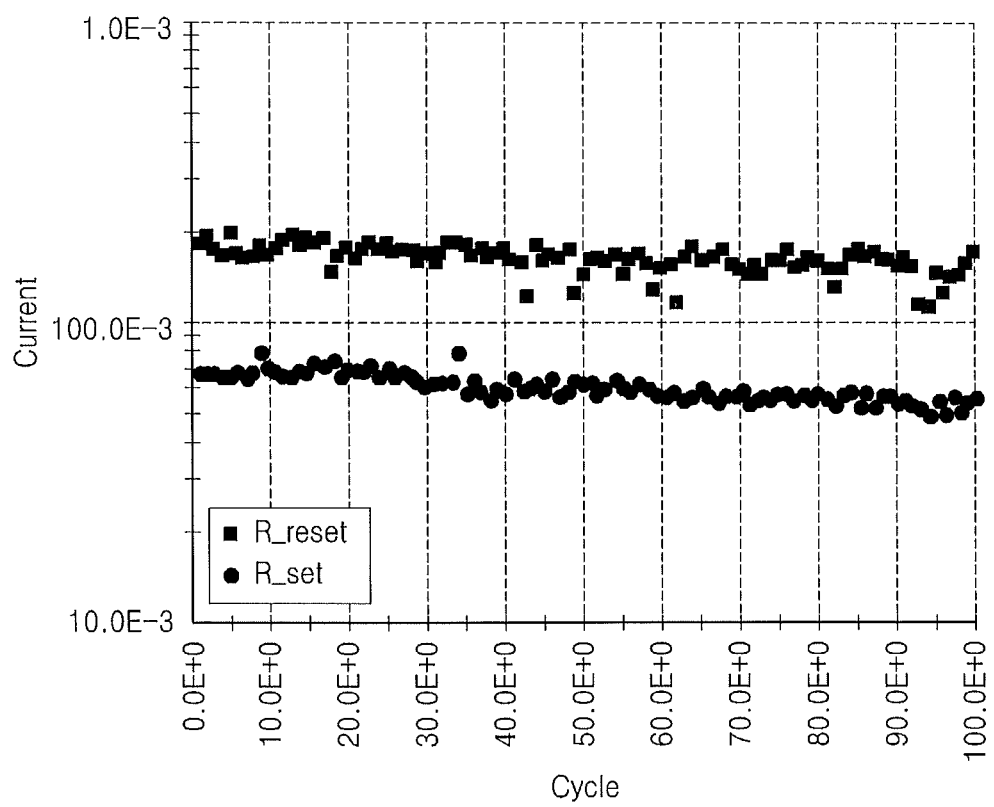
FIG. 12 is a graph showing cycling endurance of a resistive memory device using a diffusion barrier layer.
Figure 13:
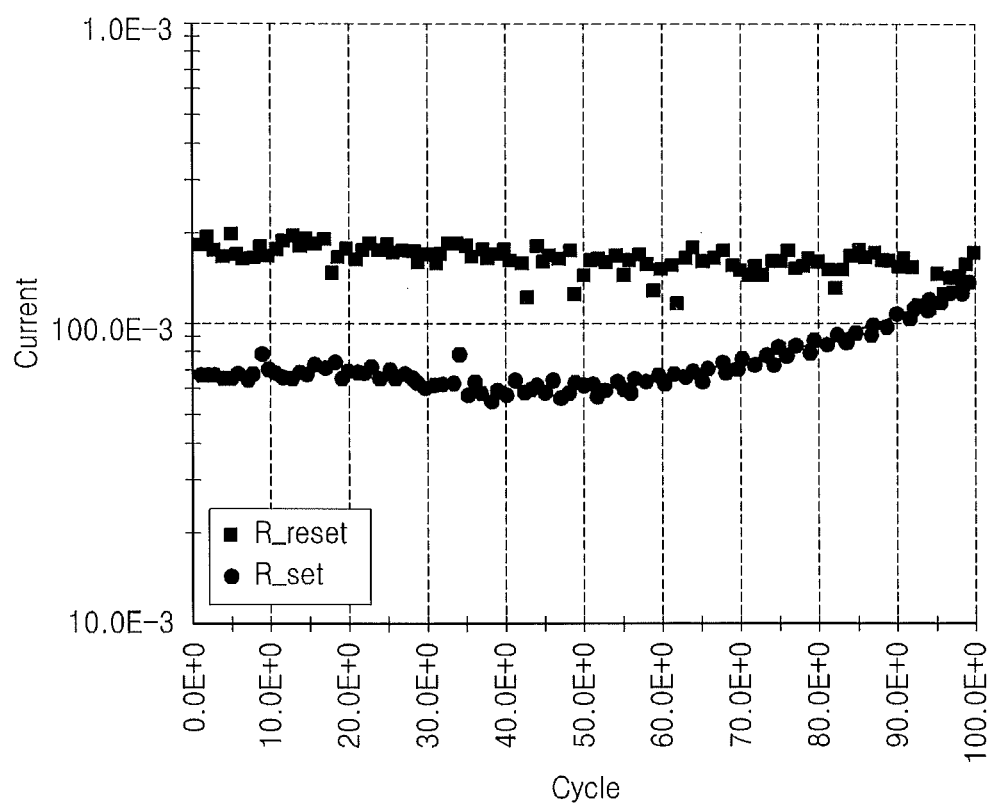
FIG. 13 is a graph showing cycling endurance of a resistive memory device without a diffusion barrier layer.
Figure 14:
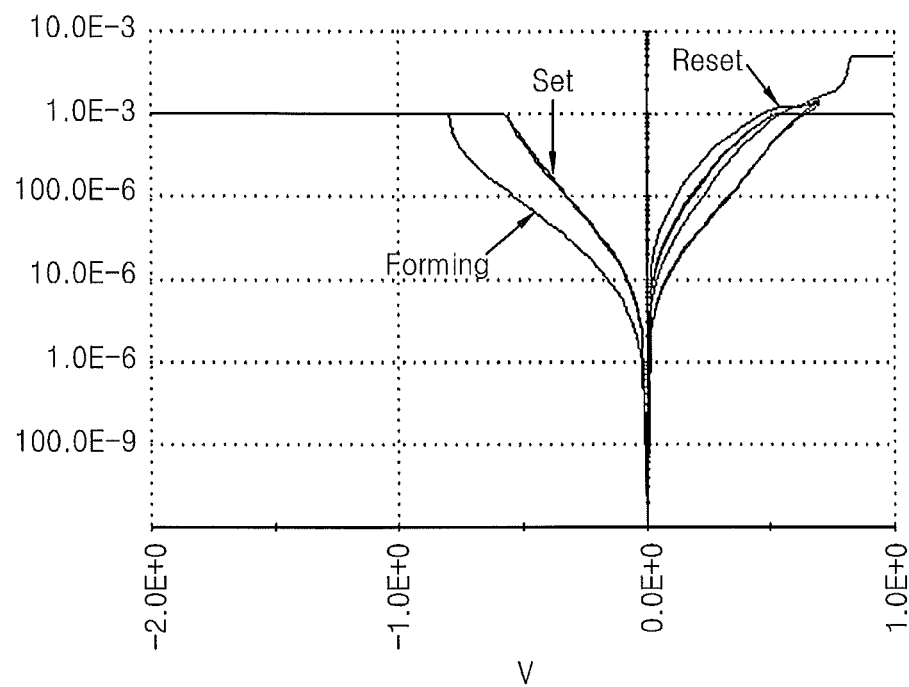
FIGS. 14 through 18 are graphs showing switching of the resistive memory device of FIG. 1, including a diffusion barrier layer having a thickness of 8 Å, 12 Å, 16 Å, 20 Å, and 24 Å, respectively.
Figure 15:
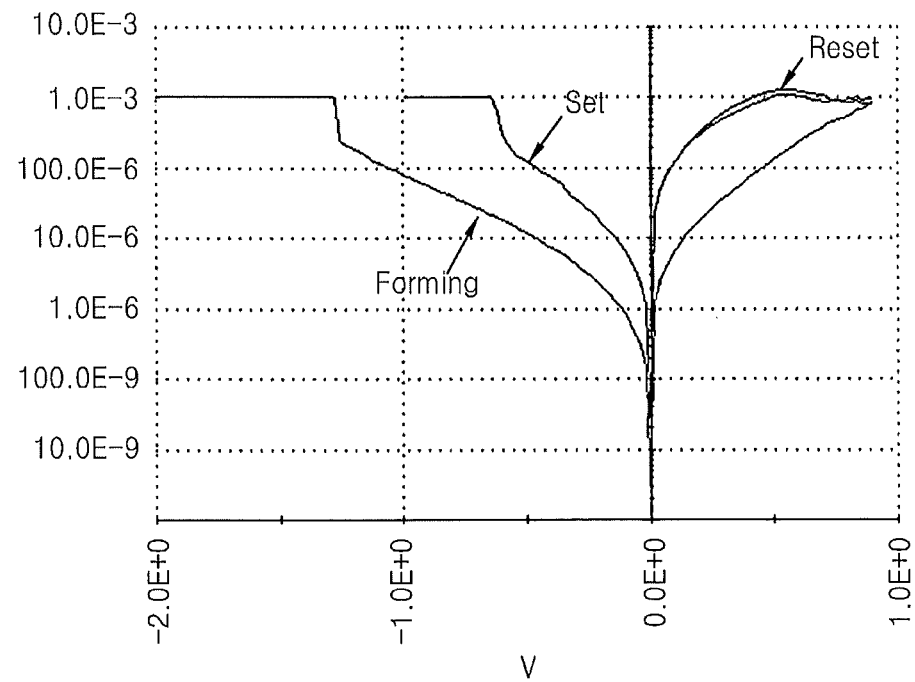
Figure 16:
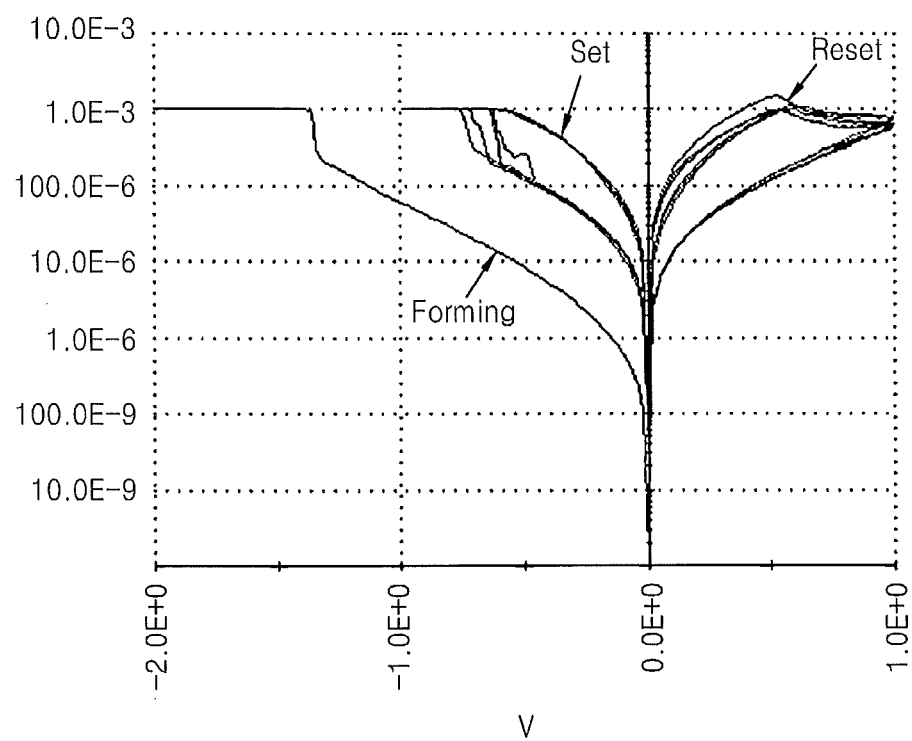
Figure 17:
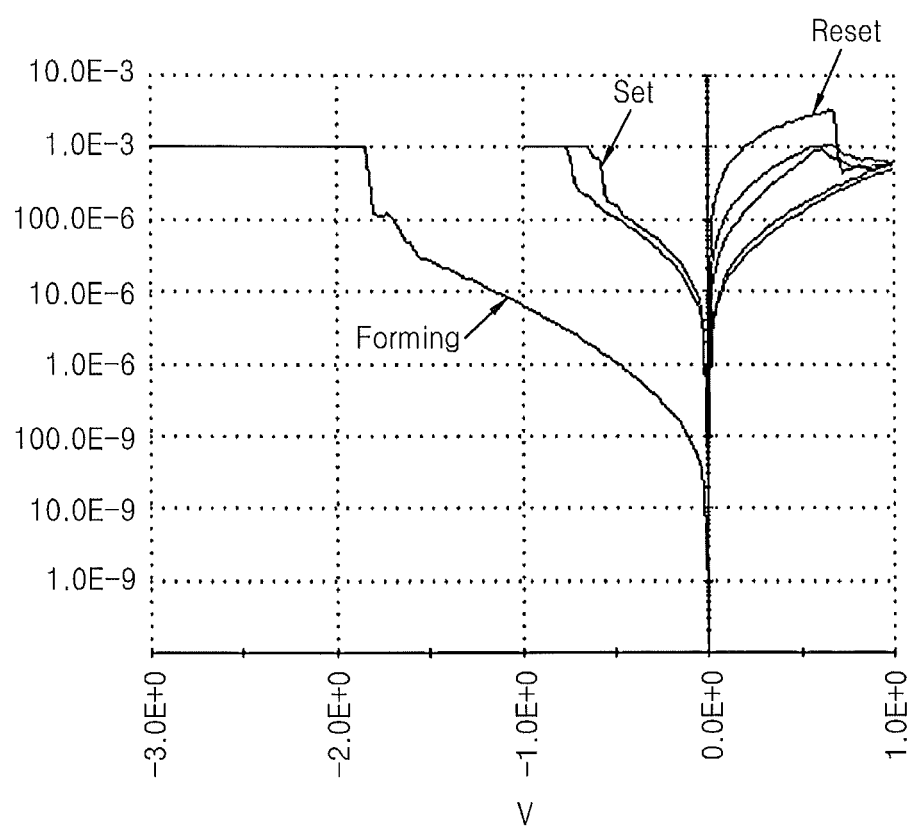
Figure 18:
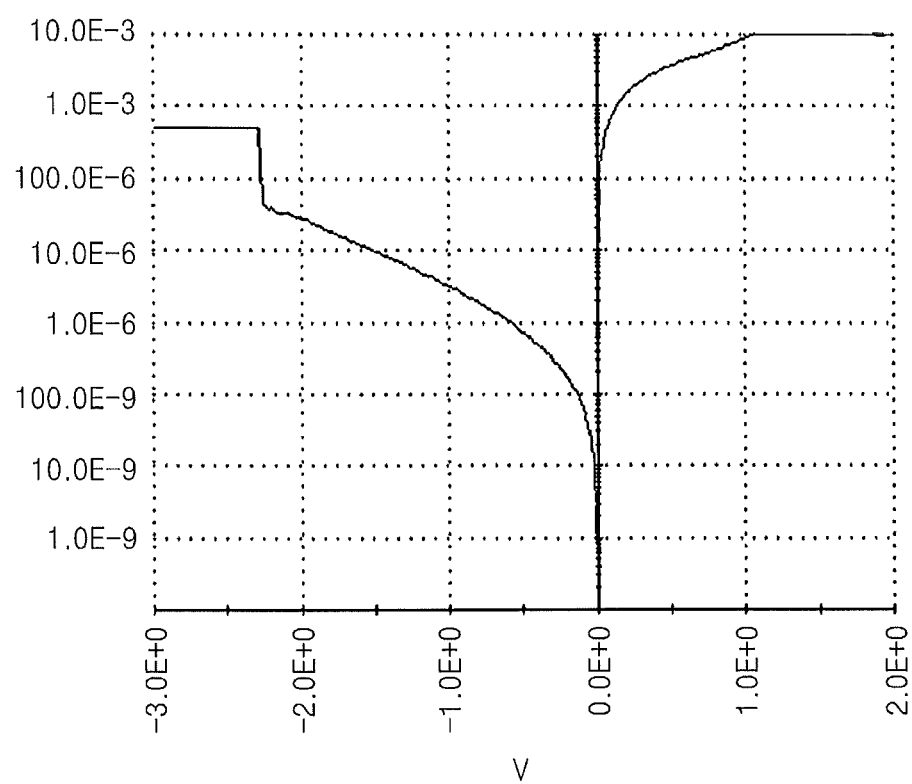

Referring to FIGS. 12 and 13, cycling endurance of the resistive memory device is improved when a repetitive operation is performed in the resistive memory device including the diffusion barrier layer, compared with the resistive memory device without the diffusion barrier layer.

The diffusion barrier layers according to the embodiments of the inventive concept may include a metal oxide, for example, an aluminum oxide ($Al_xO_y$, here, x and y are positive real numbers, respectively). A thickness of the diffusion barrier layer disposed on the sides of the electrodes and the data storage layer may be thick in order to prevent oxygen from being diffused between the electrodes and the data storage layer. However, if a thickness of the diffusion barrier layer including an aluminum oxide ($Al_xO_y$, here, x and y are positive real numbers, respectively) is greater than 50 Å, the diffusion barrier layer becomes an insulator and thus the diffusion barrier layer is inappropriate.

Also, an oxide has high electrical resistance. Thus, if a thickness of the diffusion barrier layer is thick, a current is prevented from flowing to the electrodes. Accordingly, a thickness of the diffusion barrier layer may be appropriately thin so that a tunneling current may flow between the data storage layer and the electrodes. Finally, in order to prevent diffusion of oxygen and to allow a tunneling current to flow between the data storage layer and the electrodes, a thickness of the diffusion barrier layer may be appropriately adjusted.

FIGS. 14 through 18 are graphs showing switching of the resistive memory device 101 of FIG. 1, including the diffusion barrier layer 41 having a thickness of 8 Å, 12 Å, 16 Å, 20 Å, and 24 Å, respectively. An experiment was performed in a structure where the diffusion barrier layer 41 is interposed between the data storage layer 30 and the upper electrode 60 and the oxygen getter layer 50 is interposed between the diffusion barrier layer 41 and the data storage layer 30, as illustrated in FIG. 1. In the experiment, it was identified that switching of the resistive memory device 101 is stable when a thickness of the diffusion barrier layer was 8 Å, 12 Å, 16 Å, and 20 Å, respectively. However, reset switching did not occur when a thickness of the diffusion barrier layer 41 was 24 Å.

Accordingly, in order to prevent diffusion of oxygen and to allow a tunneling current to flow between the data storage layer and the electrodes, a thickness of the diffusion barrier layer (for example, $Al_xO_y$, here, x and y are positive real numbers, respectively) may be less than 50 Å, for example, 24 Å.

Figure 19:
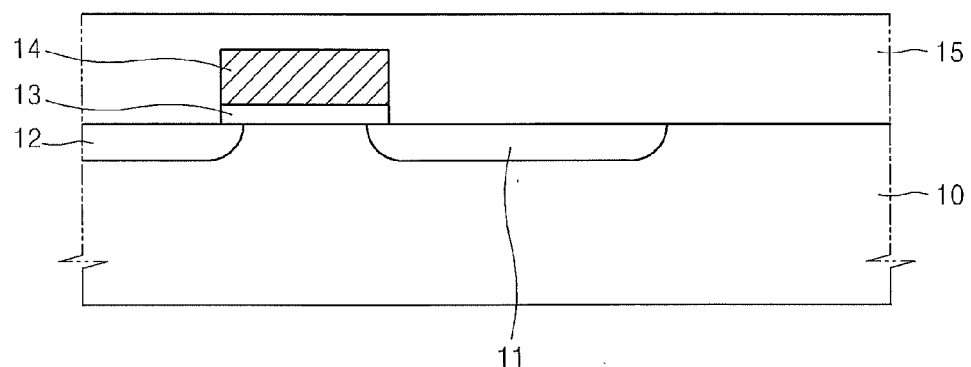
FIGS. 19 through 21 are cross-sectional views illustrating a method of manufacturing a nonvolatile memory device, according to an embodiment of the inventive concept.
Figure 20:
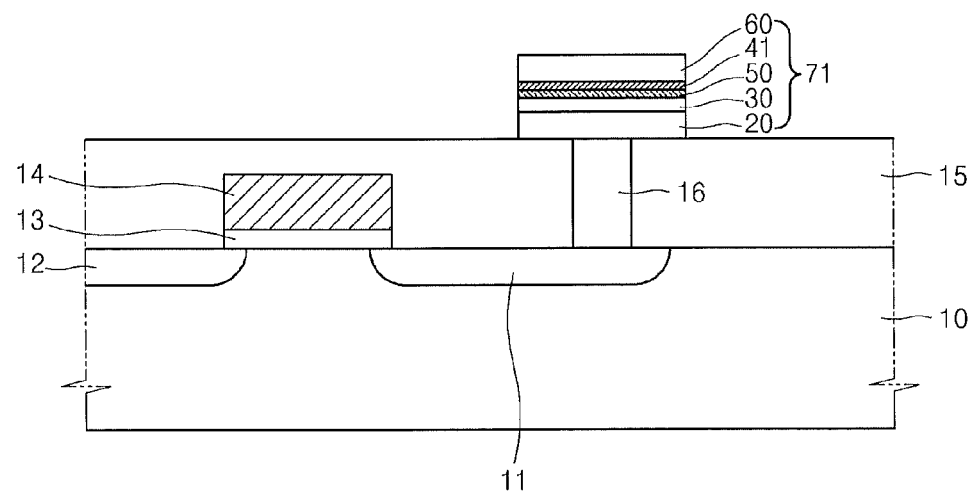
Figure 21:
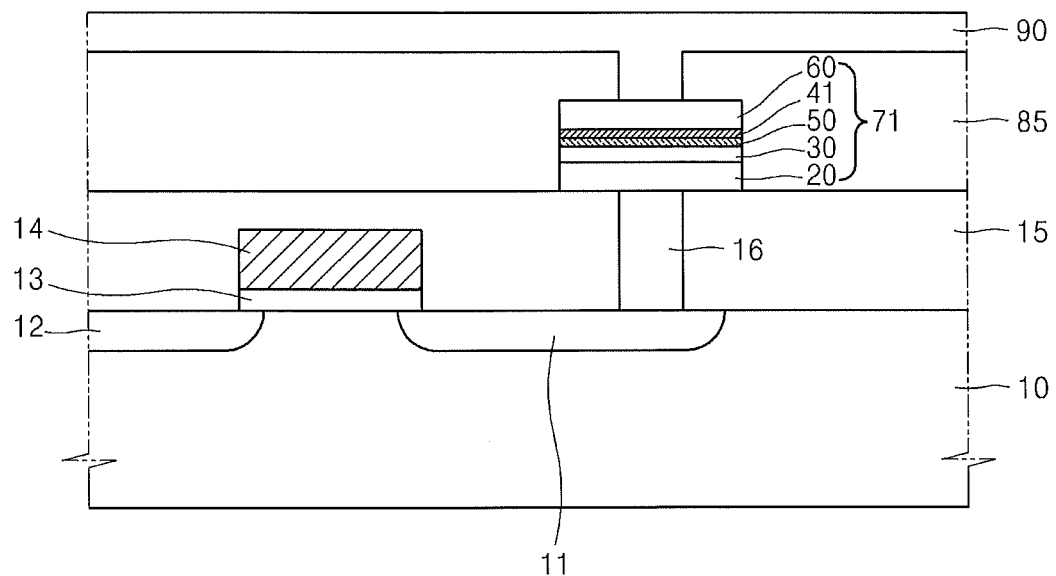

FIGS. 19 through 21 are cross-sectional views illustrating a method of manufacturing a nonvolatile memory device, according to an embodiment of the inventive concept. Referring to FIG. 19, the gate pattern including the gate insulating layer 13 and the gate electrode 14 is formed on the semiconductor substrate 10. The gate insulating layer 13 may be formed by using thermal oxidation. The source region 12 and the drain region 11 that are adjacent to the gate pattern are formed by ion injection using the gate pattern as a mask. The first interlayer insulating layer 15 is formed to cover the gate pattern by using chemical vapor deposition.

Referring to FIG. 20, the contact plug 16 is formed in the first interlayer insulating layer 15 to connect to the drain region 11. The storage node 71 is formed on the first interlayer insulating layer 15 to connect to the contact plug 16. The storage node 71 includes the data storage layer 30, the oxygen getter layer 50, the diffusion barrier layer 41, and the upper electrode 60 that are sequentially formed on the lower electrode 20 in the order stated. The lower electrode 20 and the upper electrode 60 may each include at least one selected from the group consisting of tungsten (W), polysilicon (poly-Si), aluminum (Al), titanium nitride silicide (TiSiN), and a conductive nitride (for example, a titanium nitride (TiN), a tantalum nitride (TaN), a tungsten nitride (WN), a titanium aluminum nitride (TiAlN), or a tantalum aluminum nitride (TaAlN). The data storage layer 30 may include a metal oxide of which the electrical resistance changes according to an applied voltage, wherein the metal oxide may include a magnesium oxide (MgO). A material used to form the oxygen getter layer 50 may have a higher bonding strength with oxygen than that of a material used to form the data storage layer 30. For example, when the data storage layer 30 includes magnesium oxide (MgO), the oxygen getter layer 50 may include titanium (Ti).

A material used to form the diffusion barrier layer 41 may have a higher bonding strength with oxygen than that of a material used to form the data storage layer 30. For example, the diffusion barrier layer 41 may include an aluminum oxide ($Al_xO_y$, here, x and y are positive real numbers, respectively). For example, the diffusion barrier layer 41 may be formed by using physical vapor deposition, chemical vapor deposition, pulse laser deposition, organic metal vapor deposition, a sol-gel process, or spray thermal deposition. When the diffusion barrier layer 41 includes an aluminum oxide ($Al_xO_y$, here, x and y are positive real numbers, respectively), the diffusion barrier layer 41 including an aluminum oxide may be formed by oxidizing a surface of an aluminum electrode.

Figure 22:
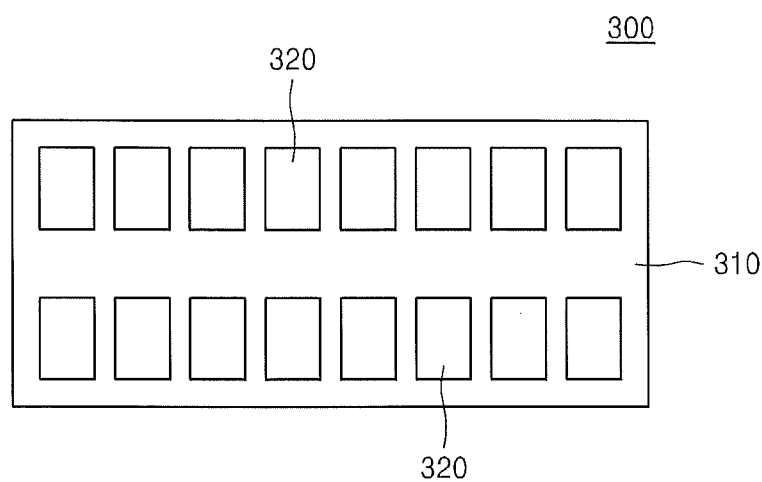
FIG. 22 is a plan view of a memory module including a nonvolatile memory device, according to an embodiment of the inventive concept.

FIG. 22 is a plan view of a memory module 300 including a nonvolatile memory device, according to an embodiment of the inventive concept. The memory module 300 includes a printed circuit board (PCB) 310 and a plurality of semiconductor packages 320. The plurality of semiconductor packages 320 may include the nonvolatile memory device manufactured as in the embodiments of the inventive concept. In particular, the plurality of semiconductor packages 320 may include the nonvolatile memory device including the storage node 71, 72, 73, 74, 75, and/or 76 described with reference to FIGS. 1 through 6. The memory module 300 according to the inventive concept may be a single in-lined memory module (SIMM) including the plurality of semiconductor packages 320 mounted only on one surface of a PCB or a dual in-lined memory module (DIMM) including the plurality of semiconductor packages 320 mounted on both surfaces of the PCB. Also, the memory module 300 according to the inventive concept may be a fully buffered DIMM including an advanced memory buffer (AMB) for providing signals from the outside to each of the plurality of semiconductor packages 320.

Figure 23:
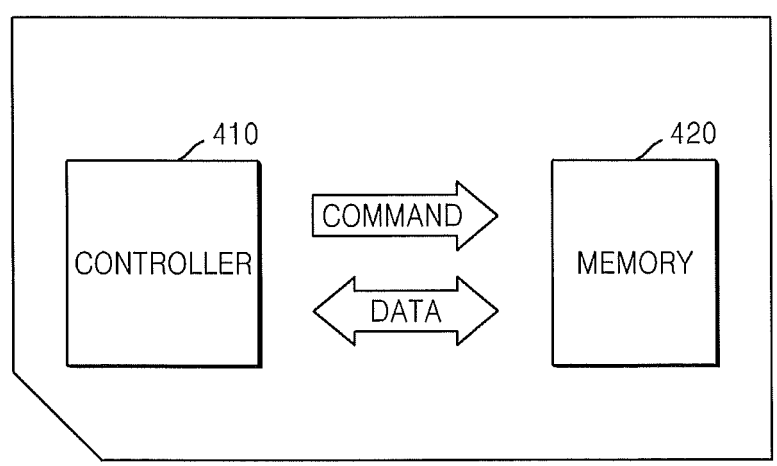
FIG. 23 is a block diagram of a memory card including a nonvolatile memory device, according to an embodiment of the inventive concept.

FIG. 23 is a block diagram of a memory card 400 including a nonvolatile memory device, according to an embodiment of the inventive concept. The memory card 400 may include a controller 410 and a memory 420, wherein the controller 410 and the memory 420 are arranged to exchange electric signals with each other. For example, when the controller 410 provides a command to the memory 420, the memory 420 may transmit data to the controller 410. The memory 520 may include a semiconductor device manufactured according to the method of embodiments of the inventive concept. In particular, the memory 420 may include the nonvolatile memory device including the storage node 71, 72, 73, 74, 75, and/or 76 described with reference to FIGS. 1 through 6.

The memory card 400 may be any of various types of memory cards, for example, a memory stick card, a smart media (SM) card, a secure digital (SD) card, a mini-SD card, and a multimedia card (MMC).

Figure 24:
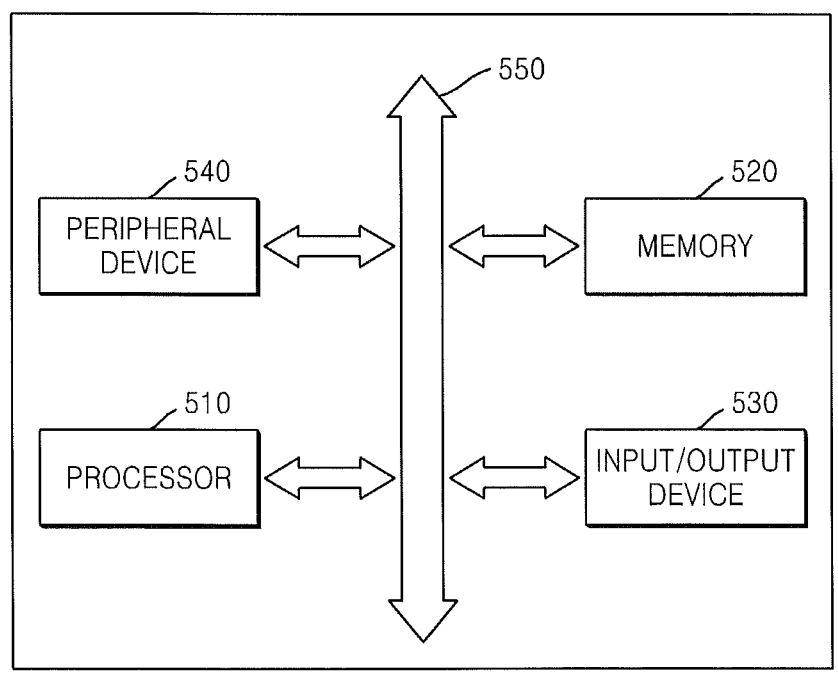
FIG. 24 is a block diagram of a system including a semiconductor device, according to an embodiment of the inventive concept.

FIG. 24 is a block diagram of a system 500 including a semiconductor device, according to an embodiment of the inventive concept. In the system 500, a processor 510, an input/output device 530, and a memory 520 may communicate data with each other via a bus 550. The memory 520 in the system 500 may include a random access memory (RAM) or a read-only memory (ROM). Also, the system 500 may include a peripheral device 540 such as a floppy disk drive or a compact disk (CD)-ROM drive. The memory 520 may include a semiconductor device manufactured by using the method according to the embodiments of the inventive concept. In particular, the memory 520 may include the nonvolatile memory device including the storage node 71, 72, 73, 74, 75, and/or 76 described with reference to FIGS. 1 through 6. The memory 520 may store therein code and data for operating the processor 510. The system 500 may be used in mobile phones, MP3 players, navigation devices, portable multimedia players (PMPs), solid state disks (SSDs), or household appliances.

The inventors of the inventive concept suggested a structure in which a noble metal is not used as a material to form the electrodes of a resistive memory device and cycling endurance thereof is improved. Such a structure may be realized by forming a diffusion barrier layer which prevents oxygen from being diffused between electrodes and a data storage layer. However, such a structure may be also applied when a noble metal is used as a material to form the electrodes of a resistive memory device. Accordingly, in the inventive concept, a noble metal may be used as a material to form the electrodes of a resistive memory device.

Various types of unit resistor memory cells are described above. The unit resistor memory cells may be arranged two-dimensionally to form a resistor memory cell array. A resistor memory cell array according to an embodiment of the inventive concept may be a cross-point memory array which does not require a selection transistor which is used to access each resistor memory cell. Also, a resistor memory cell array according to another embodiment of the inventive concept may include a selection transistor for accessing each resistor memory cell. The resistor memory cell array including the selection transistor may be manufactured by using a general complementary metal-oxide semiconductor (CMOS) process.

Firstly, the cross-point memory array is described. In the cross-point memory array, when a second electrode (or an upper electrode) of a resistor memory cell represents a line form, the second electrode functions as a word line. A first electrode (or a lower electrode) represents a plug form and first electrode plugs on the same column (or a row) is connected to the same conductive line which functions as a bit line. Also, a conductive line which connects the first electrode plugs with each other may function as a word line and the line-form second electrode may function as a bit line. As described above, as the resistor memory cell may be switched between two resistance states regardless of the polarity of voltage applied between two electrodes, a word line or a bit line may be maintained according to which of the electrodes a higher voltage is applied. More specifically, a cross point resistive memory cell array is described with reference to the accompanying drawings.

Figure 25:
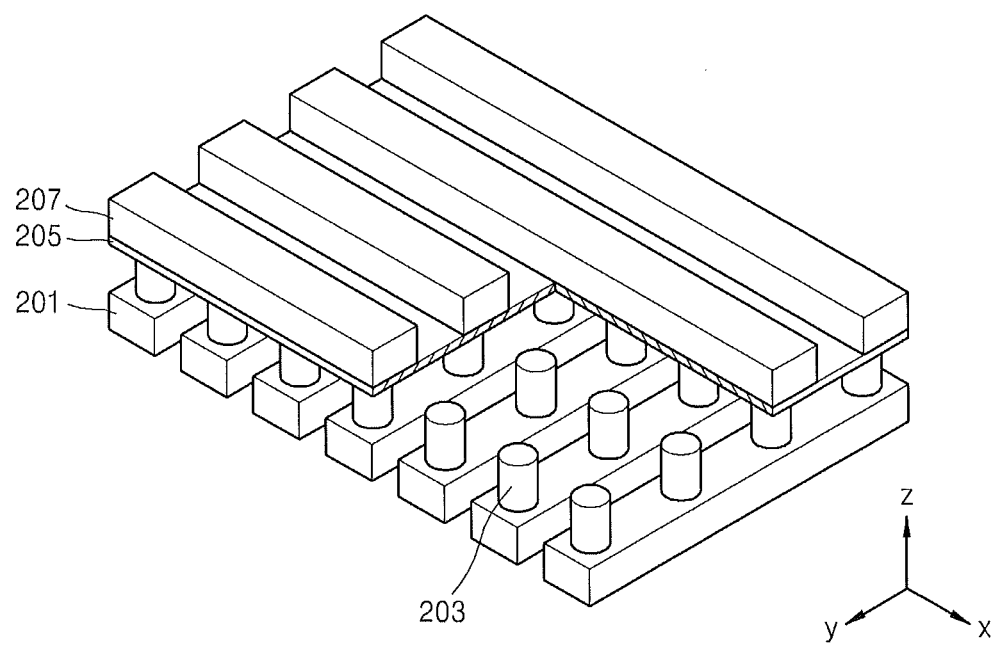
FIG. 25 is a perspective view illustrating a resistive memory cell array according to an embodiment of the inventive concept.
Figure 26:
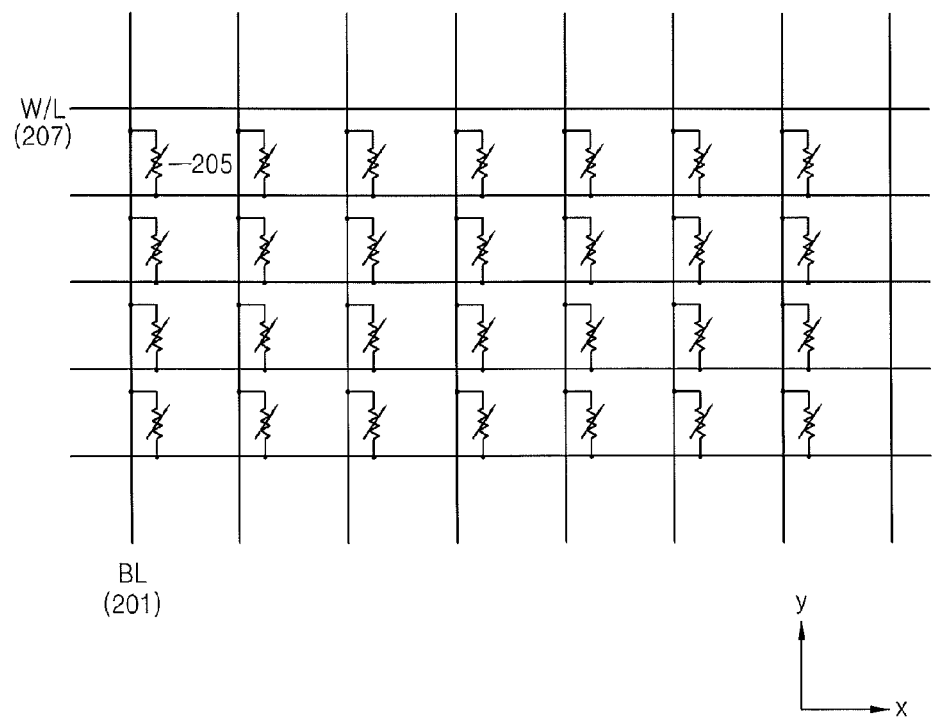
FIG. 26 is an equivalent circuit diagram of the resistive memory cell array of FIG. 25.
Figure 27:
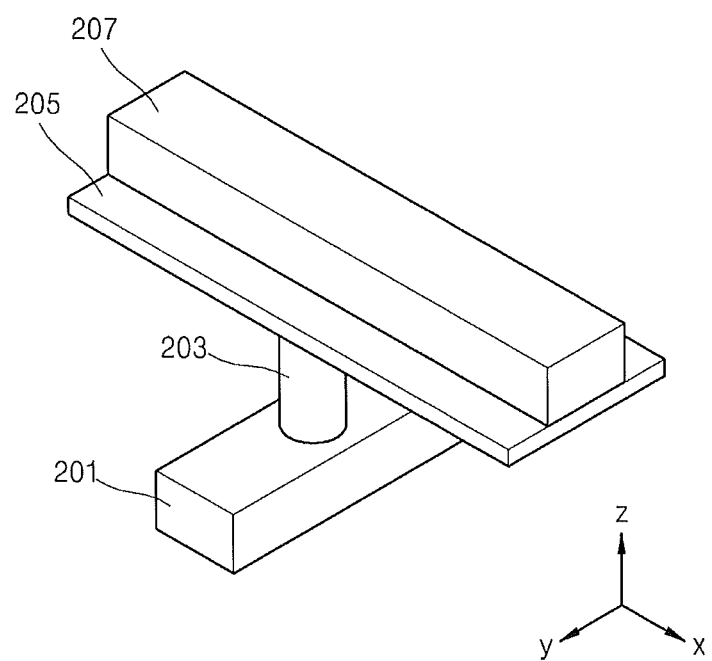
FIG. 27 is a perspective view illustrating one resistor memory cell in the resistive memory cell array of FIG. 25.

FIG. 25 is a perspective view illustrating a resistive memory cell array according to an embodiment of the inventive concept, FIG. 26 is an equivalent circuit diagram of the resistive memory cell array of FIG. 25, and FIG. 27 is a perspective view illustrating one resistor memory cell in the resistive memory cell array of FIG. 25. Referring to FIGS. 25 through 27, a plurality of second electrodes (upper electrodes) 207 that are parallel to each other in a row direction (an x-axis direction) are arranged. A plurality of conductive lines 201 that are parallel to each other in a column direction (a y-axis direction) are arranged to form a plurality of cross points with the second electrodes 207. The second electrodes 207 function as word lines and the conductive lines 201 function as bit lines. Also, the second electrodes 207 and the conductive lines 201 may function oppositely. The second electrodes (upper electrodes) 207 may each correspond to the upper electrode 60 illustrated in FIGS. 1 through 6. First electrodes (lower electrodes) 203 are disposed on the plurality of cross points where the second electrodes 207 and the conductive lines 201 cross each other. The first electrodes (lower electrodes) 203 may each correspond to the lower electrode 20 illustrated in FIGS. 1 through 6. The plurality of first electrodes 203 on the same column may be connected to the same conductive line in common.

A resistive memory element thin film 205 is interposed between the first electrodes 203 and the second electrodes 207. The resistive memory element thin film 205 may correspond to the stacked thin films interposed between the lower electrode 20 and the upper electrode 60 illustrated in FIGS. 1 through 6. That is, the resistive memory element thin film 205 may be a stacked thin film including the data storage layer 30, the oxygen getter layer 50, and the diffusion barrier layer 41. Also, the resistive memory element thin film 205 may be a stacked thin film including the diffusion barrier layer 42, the data storage layer 30, and the oxygen getter layer 50 illustrated in FIG. 2. In addition, the resistive memory element thin film 205 may be a stacked thin film including the diffusion barrier layer 42, the data storage layer 30, the oxygen getter layer 50, and the diffusion barrier layer 41 illustrated in FIG. 3. Moreover, the resistive memory element thin film 205 may be a stacked thin film including the data storage layer 30, the oxygen getter layer 50, the diffusion barrier layer 41, and the capping diffusion barrier layer 43 illustrated in FIG. 4. Furthermore, the resistive memory element thin film 205 may be a stacked thin film including the diffusion barrier layer 42, the data storage layer 30, oxygen getter layer 50, and the capping diffusion barrier layer 43. The resistive memory element thin film 205 may be also a stacked thin film including the diffusion barrier layer 42, the data storage layer 30, the oxygen getter layer 50, the diffusion barrier layer 41, and the capping diffusion barrier layer 43.

In the current embodiment of the inventive concept, the resistive memory element thin film 205 may have a various forms and may cover the entire memory cell region. On the other hand, the resistive memory element thin film 205 may have the same form as the second electrodes 207. A diameter of the first electrode 203 is smaller than a width of the conductive line 201 and a width of a second electrode 207.

Although not illustrated, the conductive lines 201 and the second electrodes 207 are selected by an appropriate row/column reader so that resistor memory cells located on their cross points are selected. A sense amplifier is connected to the bit lines so as to read information stored in the selected resistor memory cells. The structure and operations of the row/column reader and the sense amplifier are well known and thus detailed descriptions thereof are omitted.

Figure 28:
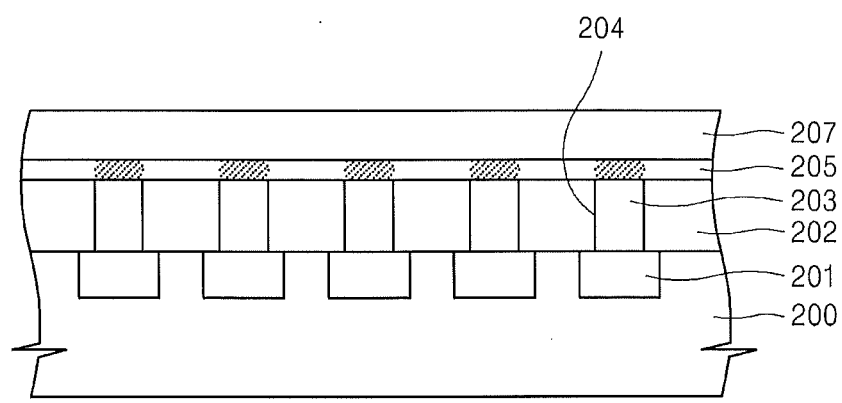
FIGS. 28 and 29 are cross sectional diagrams of the resistive memory cell array of FIG. 25, taken along a second electrode direction and a conductive line direction, respectively.
Figure 29:
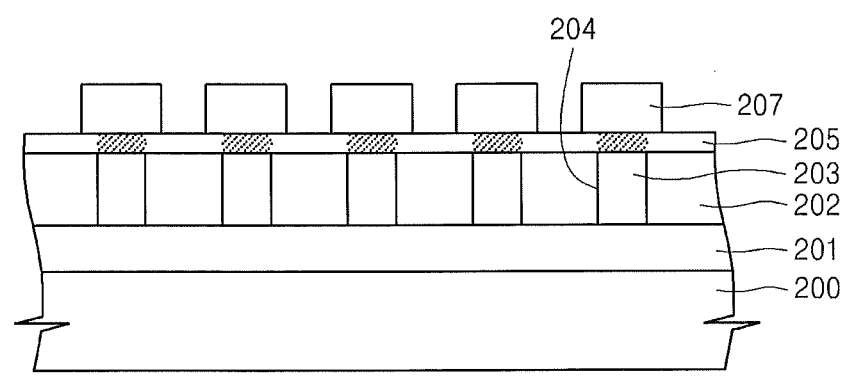
Figure 30:
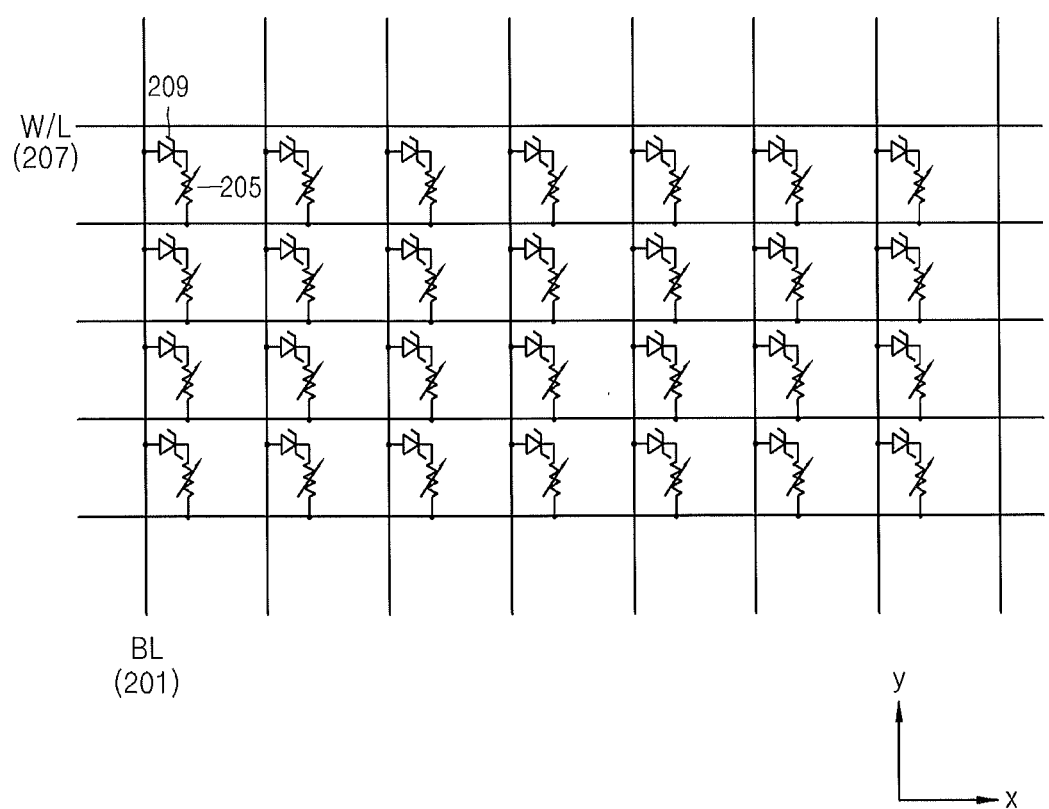
FIG. 30 is an equivalent circuit diagram of a resistive memory array when diodes are added to the resistive memory cell array of FIG. 25.

Forming of the resistor memory cell is already described. Forming of the conductive lines 201 will now be described with reference to FIGS. 28 and 29. FIGS. 28 and 29 are cross-sectional views of the resistive memory cell array of FIG. 25, taken along a second electrode direction and a conductive line direction, respectively. The conductive lines 201 may be formed by forming a conductive material such as impurity-doped multicrystalline silicon on a substrate 200 and patterning the substrate 200. Also, the conductive lines 201 may be formed by forming a mask for defining conductive lines on the substrate 200 and by injecting impurity ions in exposed portions by the mask. An insulating layer 202 is formed and then patterned to form contact holes 204, which define the first electrodes 203. A conductive material is deposited to fill the contact holes 204 and a planarization process is performed to form the first electrodes 203 defined in the contact holes 204. The resistive memory element thin film 205 is formed and then a conductive material for the second electrodes 207 is formed on the resistive memory element thin film 205. The conductive material for the second electrodes 207 is patterned to form the second electrodes 207.

The specific conductive lines 201 and the specific second electrodes 207 are selected to select the resistor memory cells disposed on their cross points. In order to prevent leakage current from flowing to resistor memory cells other than the selected resistor memory cells, a resistor memory cell array illustrated in FIG. 30 may further include diodes 209. The diodes 209 are each interposed between the first electrodes 203 and the conductive lines 201. The diodes 209 may be formed by forming the conductive lines 201 by doping the conductive lines 201 with polysilicon and impurity ions, depositing an insulating layer on the conductive lines 201, forming contact holes that define the first electrodes, and injecting conductive impurities that are opposite to the doped impurities or injected impurities to the contact holes.

Instead of the diodes 209, Schottky barrier type contacts may be formed at the interface of the conductive lines 201 and the first electrodes 203. In another embodiment of the inventive concept, the diodes 209 may be bi-directional diodes.

Figure 31:
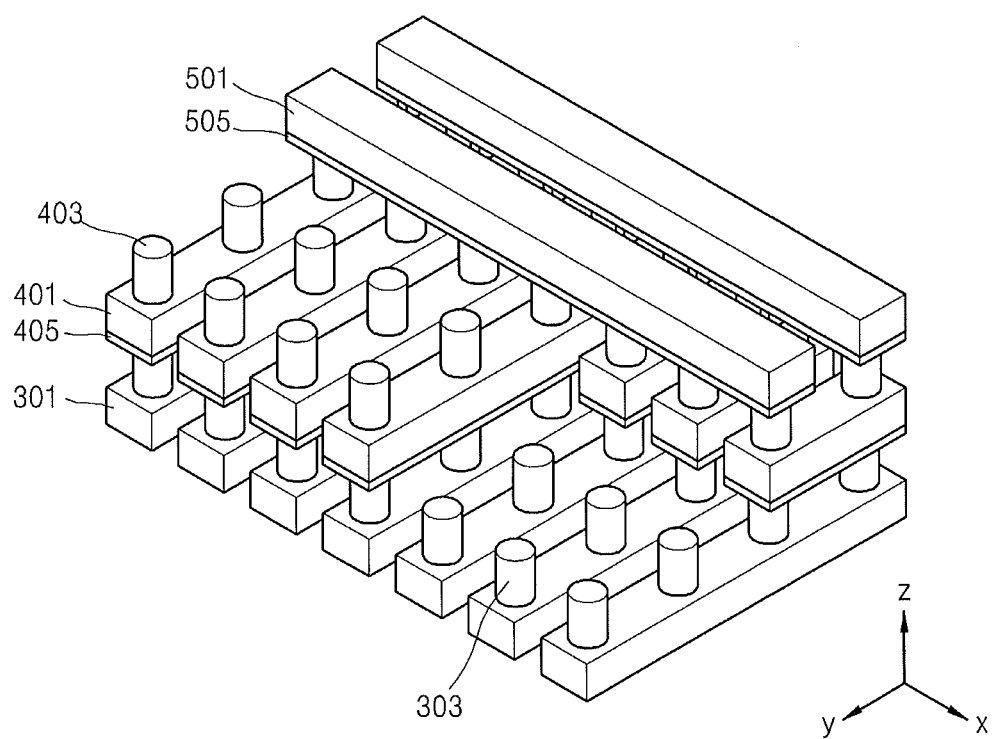
FIG. 31 is a perspective view schematically illustrating a multi-level resistive memory cell array, according to another embodiment of the inventive concept.

FIG. 31 is a perspective view schematically illustrating a multi-level resistive memory cell array according to another embodiment of the inventive concept. For clear understanding, a part of the multi-level resistive memory cell array is shown. In the multi-level resistive memory cell array according to the current embodiment of the inventive concept, unit memory cells may be arranged not only in parallel with each other and two-dimensionally but also perpendicular to each other. Electrode lines on two layers that are adjacent to each other are perpendicular to each other, and plug type electrodes and a resistive memory element thin film are disposed on the cross points of the electrode lines. The plug type electrodes connect the conductive line on a lower layer to the resistive memory element thin film disposed below the electrode line on an upper layer.

In the multi-level resistive memory cell array according to the current embodiment of the inventive concept, the conductive line on the lowermost layer and the electrode line on the uppermost layer functions as any one of word lines and bit lines under a given voltage. However, the electrode line interposed between the electrode line on the uppermost layer and the conductive line on the lowermost layer functions as a word line and a bit line under a given voltage condition.

More specifically, the multi-level resistive memory cell array is described with reference to FIG. 31. In FIG. 3, three layers of conductive lines 301, 401, and 501 are illustrated. The conductive lines 301 at a lowermost layer are extended in a column direction (an y-axis direction) in correspondence to the conductive lines 201 of FIG. 25. The electrode lines 401 at a second layer are extended in a column direction (a y-axis direction) and a resistive memory element thin film line 405 is disposed on the lower surfaces of the electrode lines 401. The electrode plugs 303 are disposed between the electrode lines 401 and the conductive line 301. The electrode lines 501 at a third layer cross with the electrode lines 401 at the second layer and are extended in a row direction (an x-axis direction). Electrode plugs 403 are disposed on the cross points of the electrode lines 501 at the third layer and the electrode lines 401 at the second layer. Similarly, a resistive memory element thin film line 505 is disposed on the lower surfaces of the electrode lines 501.

The electrode lines 401 are regarded as word lines in consideration of the electrode plugs 303. However, the electrode lines 401 are regarded as bit lines in consideration of the electrode plugs 403 and the electrode lines 510 as word lines.

Although not illustrated, in order to form a current path, one of the ends of the electrode lines and the conductive lines may be connected to a drain of a transistor through a connection means such as a contact plug, wherein the drain of a transistor is formed on a substrate and is connected to a source. Also, the other ends of the electrode lines and the conductive lines are connected to a row/column reader.

In the multi-level resistive memory cell array according to the current embodiment of the inventive concept, the resistor memory cells may be packaged not only in parallel to each other but also perpendicular to each other so that a highly integrated memory device may be realized.

In the nonvolatile memory device according to the inventive concept, switching of the resistive memory device may be stable and cycling endurance thereof may be improved even if the electrodes including a material other than a noble material are used.

In the method of manufacturing the nonvolatile memory device according to the inventive concept, a manufacturing cost thereof may be reduced and contamination generated during a manufacturing process thereof may be prevented as the electrodes including a material other than a noble material are used.

While the inventive concept has been particularly shown and described with reference to exemplary embodiments thereof, it will be understood that various changes in form and details may be made therein without departing from the spirit and scope of the following claims.

What is claimed is:

1. A nonvolatile memory cell, comprising:
   first and second electrodes;
   a data storage layer extending between said first and second electrodes;
   an oxygen diffusion barrier layer extending between said data storage layer and said first electrode; and
   an oxygen gettering layer extending between said oxygen diffusion barrier layer and said data storage layer.

2. The memory cell of claim 1, wherein said oxygen diffusion barrier layer comprises aluminum oxide and said oxygen gettering layer comprises titanium.

3. The memory cell of claim 1, wherein said data storage layer comprises magnesium.

4. The memory cell of claim 1, wherein at least one of said first and second electrodes comprises a material selected from a group consisting of tungsten, polysilicon, aluminum, titanium nitride silicide and conductive nitrides.

5. The memory cell of claim 1, wherein said data storage layer comprises a metal oxide.

6. The memory cell of claim 1, wherein said data storage layer comprises magnesium oxide.

7. The memory cell of claim 1, wherein said oxygen gettering layer comprises a material having a higher bonding strength with oxygen relative to said data storage layer.

8. The memory cell of claim 1, further comprising a capping diffusion barrier layer contacting sidewalls of said first and second electrodes, said data storage layer and said oxygen diffusion barrier layer, said capping diffusion barrier layer comprising the same material as said oxygen diffusion barrier layer.

9. A nonvolatile memory cell, comprising:
  first and second electrodes;
  a data storage layer extending between said first and second electrodes; a4 an oxygen diffusion barrier layer extending between said data storage layer and said first electrode; and
  a capping diffusion barrier layer contacting sidewalls of said first and second electrodes, said data storage layer and said oxygen diffusion barrier layer, said capping diffusion barrier layer comprising the same material as said oxygen diffusion barrier layer.

10. The memory cell of claim 9, wherein at least one of said first and second electrodes comprises a material selected from a group consisting of tungsten, polysilicon, aluminum, titanium nitride silicide and conductive nitrides.

11. The memory cell of claim 9, wherein said data storage layer comprises a metal oxide.

12. The memory cell of claim 9, wherein said data storage layer comprises magnesium oxide.

13. The memory cell of claim 9, further comprising an oxygen gettering layer extending between said oxygen diffusion barrier layer and said data storage layer.

14. The memory cell of claim 13, wherein said oxygen gettering layer comprises a material having a higher bonding strength with oxygen relative to said data storage layer.

15. The memory cell of claim 13, wherein said oxygen diffusion barrier layer comprises aluminum oxide and said oxygen gettering layer comprises titanium.

16. The memory cell of claim 15, wherein said data storage layer comprises magnesium.

17. A nonvolatile memory cell, comprising:
  a lower electrode;
  a first oxygen diffusion barrier layer comprising aluminum oxide on said lower electrode;
  a metal oxide data storage layer on said first oxygen diffusion barrier layer;
  an oxygen gettering layer comprising titanium on said metal oxide data storage layer;
  a second oxygen diffusion barrier layer comprising aluminum oxide on said oxygen gettering layer; and
  an upper electrode on said second oxygen diffusion barrier layer.

18. The memory cell of claim 17, further comprising an aluminum oxide layer contacting sidewalls of said lower electrode, said metal oxide data storage layer and said upper electrode.

19. The memory cell of claim 17, wherein said data storage layer comprises magnesium.

20. The memory cell of claim 17, wherein at least one of said lower electrode and upper electrode comprises a material selected from a group consisting of tungsten, polysilicon, aluminum, titanium nitride silicide and conductive nitrides.

* * * * *